United States Patent
Chuang et al.

(10) Patent No.: US 9,355,209 B2
(45) Date of Patent: May 31, 2016

(54) REVISING LAYOUT DESIGN THROUGH OPC TO REDUCE CORNER ROUNDING EFFECT

(71) Applicant: TAIWAN SEMICONDUCTOR MANUFACTURING COMPANY, LTD., Hsin-Chu (TW)

(72) Inventors: Harry Hak-Lay Chuang, Singapore (SG); Cheng-Cheng Kuo, Hsinchu (TW); Ching-Che Tsai, Zhubei (TW); Bao-Ru Young, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 21 days.

(21) Appl. No.: 14/325,693

(22) Filed: Jul. 8, 2014

(65) Prior Publication Data
US 2014/0317581 A1    Oct. 23, 2014

Related U.S. Application Data

(60) Continuation-in-part of application No. 14/231,809, filed on Apr. 1, 2014, now Pat. No. 9,123,694, which is a division of application No. 13/299,152, filed on Nov. 17, 2011, now Pat. No. 8,703,595.

(51) Int. Cl.

| | | |
|---|---|---|
| *H01L 21/027* | (2006.01) | |
| *G06F 17/50* | (2006.01) | |
| *H01L 21/8234* | (2006.01) | |
| *H01L 21/28* | (2006.01) | |
| *H01L 21/3213* | (2006.01) | |
| *H01L 29/66* | (2006.01) | |
| *H01L 27/02* | (2006.01) | |
| *H01L 21/8238* | (2006.01) | |
| *G03F 1/00* | (2012.01) | |
| *H01L 29/49* | (2006.01) | |
| *H01L 29/51* | (2006.01) | |

(52) U.S. Cl.
CPC .............. *G06F 17/5081* (2013.01); *G03F 1/00* (2013.01); *G06F 17/5045* (2013.01); *H01L 21/0274* (2013.01); *H01L 21/28123* (2013.01); *H01L 21/32139* (2013.01); *H01L 21/823456* (2013.01); *H01L 21/823842* (2013.01); *H01L 27/0207* (2013.01); *H01L 29/66545* (2013.01); *H01L 29/4966* (2013.01); *H01L 29/513* (2013.01); *H01L 29/517* (2013.01)

(58) Field of Classification Search
CPC . H01L 23/532; H01L 27/0928; H01L 29/495; H01L 29/42372; H01L 29/42376; H01L 21/0274
USPC .................................................. 257/371, 412
See application file for complete search history.

(56) References Cited

U.S. PATENT DOCUMENTS

| | | | |
|---|---|---|---|
| 7,927,943 B2 | 4/2011 | Yeh et al. | |
| 7,979,829 B2 | 7/2011 | Smayling | |
| 8,003,463 B2 | 8/2011 | Anderson et al. | |
| 2012/0011479 A1* | 1/2012 | Moroz ................. | H01L 21/266 716/54 |
| 2013/0126977 A1* | 5/2013 | Chuang ............... | H01L 21/0274 257/369 |

\* cited by examiner

*Primary Examiner* — Thomas L Dickey
(74) *Attorney, Agent, or Firm* — Haynes and Boone, LLP

(57) ABSTRACT

The present disclosure provides a method of fabricating a semiconductor device. A first layout design for a semiconductor device is received. The first layout design includes a plurality of gate lines and an active region that overlaps with the gate lines. The active region includes at least one angular corner that is disposed adjacent to at least one of the gate lines. The first layout design for the semiconductor device is revised via an optical proximity correction (OPC) process, thereby generating a second layout design that includes a revised active region with a revised corner that protrudes outward. Thereafter, the semiconductor device is fabricated based on the second layout design.

20 Claims, 19 Drawing Sheets

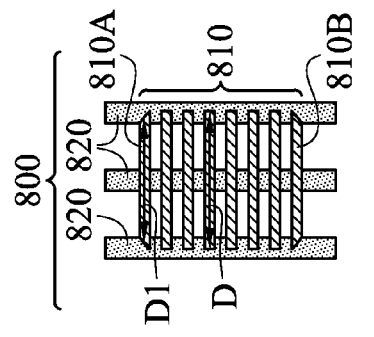
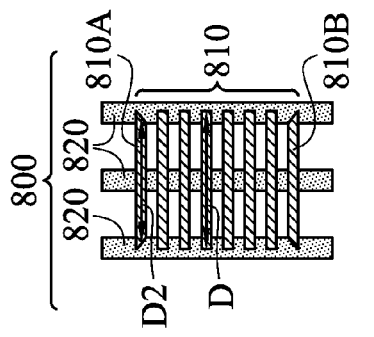
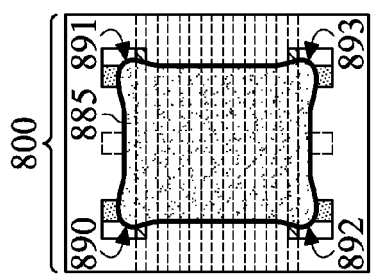
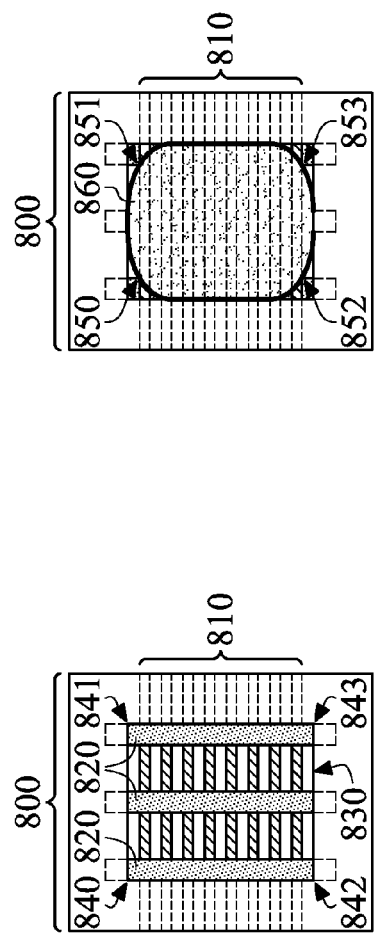
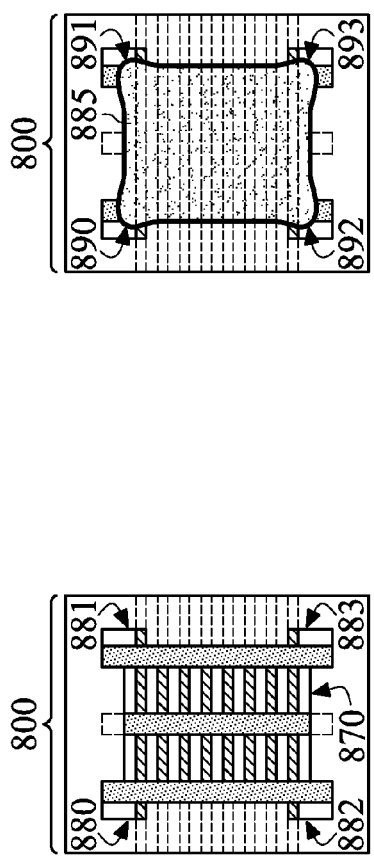

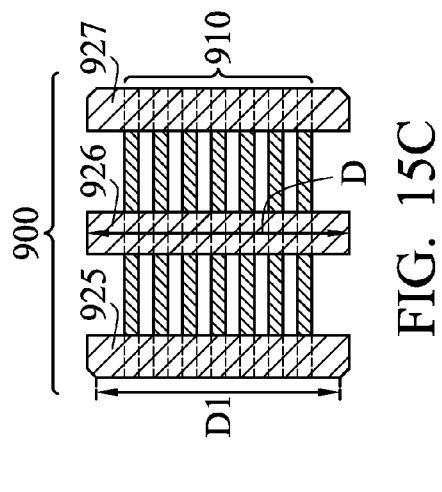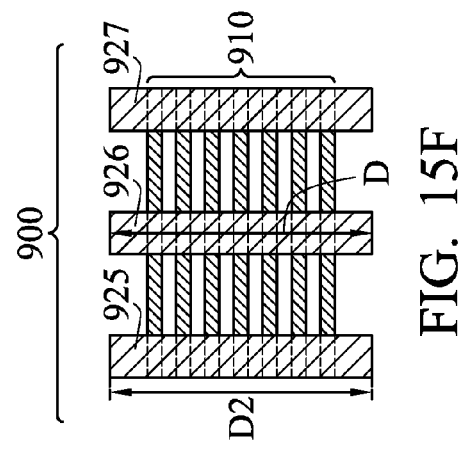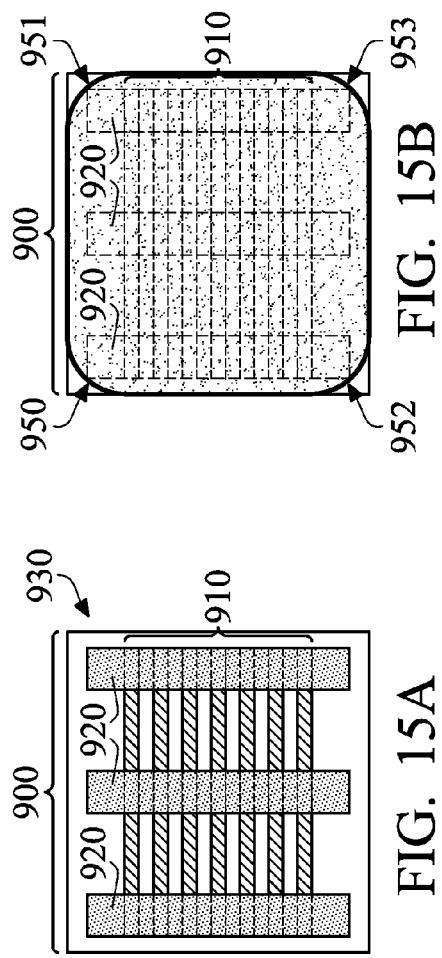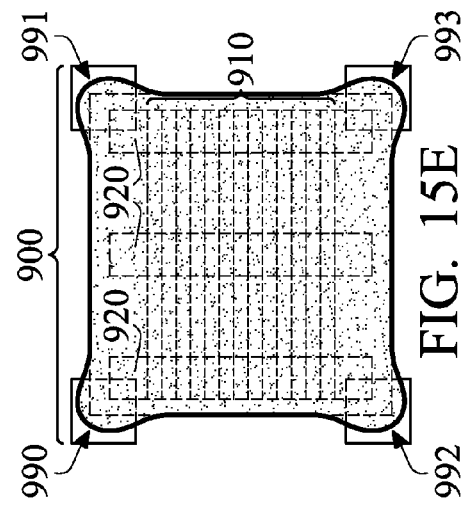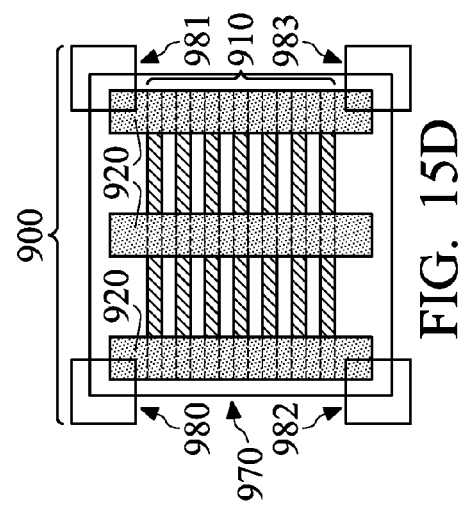

REVISING LAYOUT DESIGN THROUGH OPC TO REDUCE CORNER ROUNDING EFFECT

PRIORITY DATA

The present application is a continuation-in-part of U.S. patent application Ser. No. 14/231,809, filed on Apr. 1, 2014, which is a divisional patent application of U.S. patent application Ser. No. 13/299,152, filed on Nov. 17, 2011, both entitled "N/P Boundary Effect Reduction for Metal Gate Transistors", the disclosures of which are hereby incorporated by reference in their entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

To enhance the performance of ICs, metal gate transistors have been used in recent years. However, conventional metal gate transistors may suffer from an N/P boundary effect. In more detail, when a P-type metal gate transistor borders an N-type metal gate transistor, contamination may occur through metal diffusion across the boundary between the P-type and N-type metal gate transistors. Such contamination may degrade the threshold voltage (Vt) of the metal gate transistors. Moreover, as device sizes continue to shrink, limitations in current lithography technology may exacerbate the undesirable Vt shifting issue discussed above, thereby further degrading the performance of conventional metal gate transistors.

Therefore, while existing methods of fabricating metal gate transistors have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 14A-14F are simplified diagrammatic top views of a semiconductor device according to some embodiments of the present disclosure.

FIGS. 15A-15F are simplified diagrammatic top views of a semiconductor device according to some embodiments of the present disclosure.

SUMMARY

Figure 1:
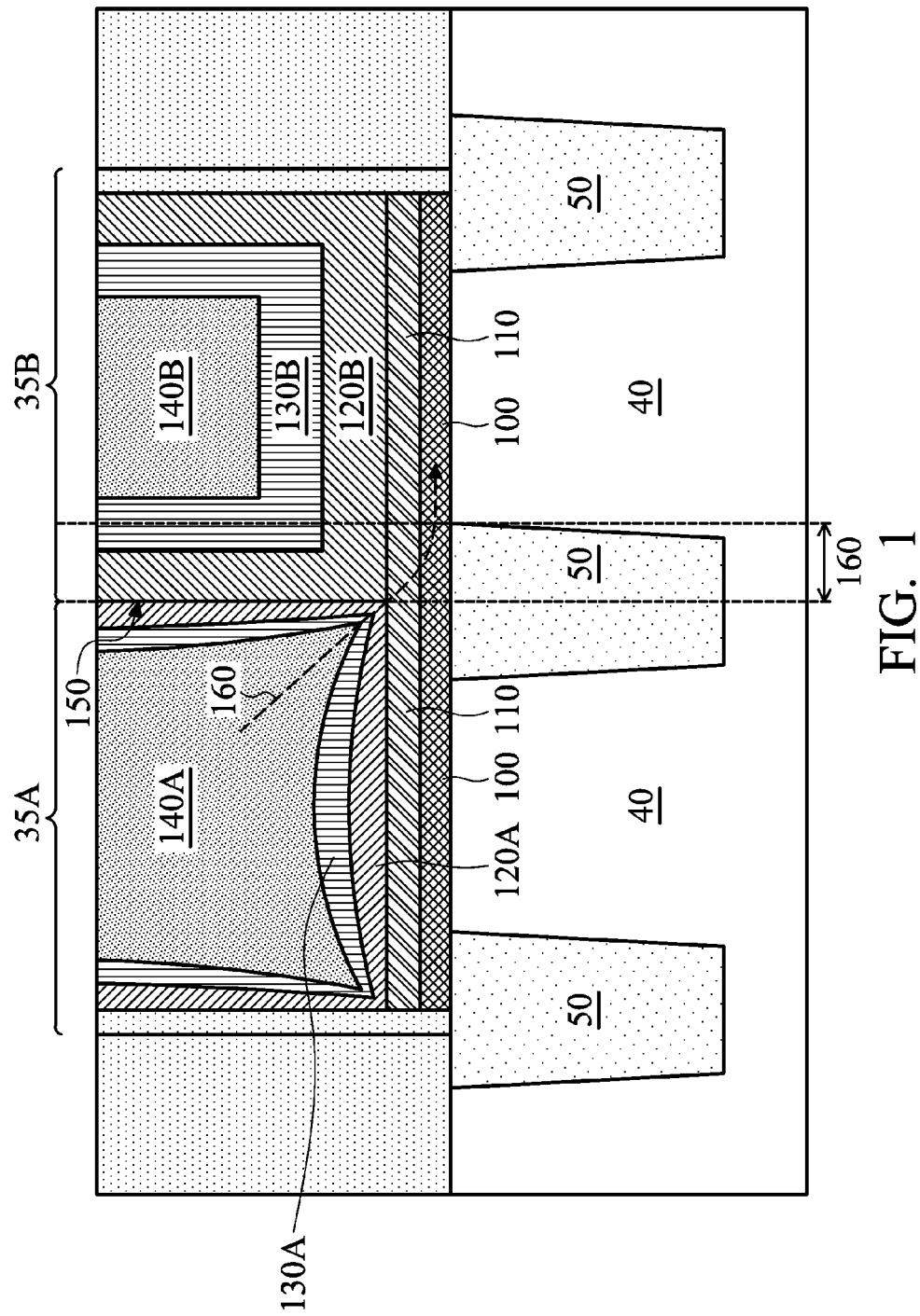
FIG. 1 is a diagrammatic cross-sectional view of a semiconductor device according to various aspects of the present disclosure.

One of the broader forms of the present disclosure involves a method of fabricating a semiconductor device. The method includes: forming a first dummy gate and a second dummy gate over a substrate; forming a patterned mask over the first and second dummy gates, the patterned mask exposing a first segment of the first dummy gate and a second segment of the second dummy gate, while covering a third segment of the first dummy gate and a fourth segment of the second dummy gate, wherein the forming the mask is carried out in a manner such that the first and second segments have significantly different lengths; replacing the first segment and the second segment with a first metal gate and a second metal gate, respectively, the first and second metal gates containing a first type metal material; and replacing the third segment and the fourth segment with a third metal gate and a fourth metal gate, respectively, the third and fourth metal gates containing a second type metal material different from the first type.

In some embodiments, one of the first and second segments is longer than the other; and a ratio of a longer one of the first and second segments to a shorter one of the first and second segments is greater than 1:1 but less than 1.5:1.

In some embodiments, the forming the patterned mask is carried out using an optical proximity correction (OPC) technique.

In some embodiments, the first and second dummy gates each extend in a first direction; and the patterned mask defines an elongate contour that extends in a second direction different from the first direction.

In some embodiments, the first direction is substantially perpendicular to the second direction; and the first and second segments are confined within the elongate contour.

In some embodiments, an end portion of the contour is wider in the first direction than a rest of the contour; and the end portion of the contour coincides with an edge of one of the first and second segments.

In some embodiments, the first and second dummy gates each contain a polysilicon material.

In some embodiments, the first type metal material includes a P-type metal; and the second type metal material includes an N-type metal.

In some embodiments, the first and second metal gates are formed over an active region; a first N/P boundary is formed by an interface between the first and third segments; a second N/P boundary is formed by an interface between the second and fourth segments; and a first distance from an edge of the active region to the first N/P boundary is less than a second distance from the edge of the active region to the second N/P boundary.

Another of the broader forms of the present disclosure involves a method of fabricating a semiconductor device. The method includes: forming a plurality of dummy gates over a substrate, the dummy gates extending along a first axis; forming a masking layer over the dummy gates, the masking layer defining an elongate opening that extends along a second axis different from the first axis, wherein the opening exposes a plurality of first portions of the dummy gates and protects a plurality of second portions of the dummy gates, wherein a tip portion of the opening has a width greater than a width of a non-tip portion of the opening, and wherein the forming the masking layer includes performing an optical proximity correction (OPC) process; replacing the first portions of the dummy gates with a plurality of first metal gates; and replacing the second portions of the dummy gates with a plurality of second metal gates different from the first metal gates.

In some embodiments, the second axis is approximately orthogonal to the first axis; and the width of the tip portion is measured along the first axis.

In some embodiments, the OPC process includes using a serif assistant feature or a hammerhead assistant feature.

In some embodiments, the first metal gates contain P-type work function metal layers; and the second metal gates contain N-type work function metal layers.

In some embodiments, the first metal gates are formed over an active region for a P-type transistor; a plurality of N/P boundaries are formed by respective pairs of the first and second metal gates; and an outer-most N/P boundary is spaced farther apart from the active region than the rest of the N/P boundaries.

In some embodiments, a ratio between the width of the tip portion of the opening and the width of the non-tip portion of the opening is greater than 1:1 but less than 1.5:1.

In some embodiments, the dummy gates each contain a polysilicon gate electrode.

Yet another of the broader forms of the present disclosure involves a semiconductor device. The semiconductor device includes: a doped active region disposed in a substrate, the doped active region having an elongate shape and extends in a first direction; a plurality of first metal gates disposed over the active region, wherein the first metal gates each extend in a second direction different from the first direction, and wherein an outer-most first metal gate has a greater dimension measured in the second direction than the rest of the first metal gates; and a plurality of second metal gates disposed over the substrate but not over the doped active region, wherein the second metal gates contain different materials than the first metal gates, and wherein the second metal gates each extend in the second direction and form a plurality of respective N/P boundaries with the first metal gates.

In some embodiments, the doped active region includes a source/drain region for a P-type transistor; the first metal gates each include a P-type work function metal; and the second metal gates each include an N-type work function metal.

In some embodiments, a distance between the doped active region and an outer-most N/P boundary exceeds a distance between the doped active region and other N/P boundaries.

In some embodiments, the first direction is approximately perpendicular to the second direction.

The present disclosure also involves a method of fabricating a semiconductor device. The method includes: receiving a first layout design for a semiconductor device, wherein the first layout design includes a plurality of gate lines and an active region that overlaps with the gate lines, and wherein the active region includes at least one angular corner that is disposed adjacent to at least one of the gate lines; revising the first layout design for the semiconductor device via an optical proximity correction (OPC) process, thereby generating a second layout design that includes a revised active region with a revised corner that protrudes outward; and fabricating the semiconductor device based on the second layout design.

The present disclosure also involves a method of fabricating a semiconductor device. The method includes: receiving a first layout design for a semiconductor device, wherein the first layout design includes a first doped region and a second doped region having a different type of conductivity from the first doped region, wherein the second doped region contains an active region therein, and wherein the first and second doped regions define an N/P boundary that includes at least one angular corner; revising the first layout design for the semiconductor device via an optical proximity correction (OPC) process, thereby generating a second layout design having an N/P boundary that is free of the angular corner; and fabricating the semiconductor device based on the second layout design.

The present disclosure also involves a method of fabricating a semiconductor device. The method includes: receiving a first layout design for a semiconductor device, wherein the first layout design includes a plurality of elongate gate lines extending in a first direction, a plurality of elongate fins extending in a second direction different from the first direction, and a rectangular window that is overlying a portion of the gate lines and the fins, the rectangular window having four corners; revising the first layout design for the semiconductor device via an optical proximity correction (OPC) process, thereby generating a second layout design that includes a revised window that includes four outwardly-protruding corners; and fabricating the semiconductor device based on the second layout design.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the terms "top," "bottom," "under," "over," and the like are used for convenience and are not meant to limit the scope of embodiments to any particular orientation. Various features may also be arbitrarily drawn in different scales for the sake of simplicity and clarity. In addition, the present disclosure may repeat reference numerals and/or letters in the various examples. This repetition is for the purpose of simplicity and clarity and does not in itself necessarily dictate a relationship between the various embodiments and/or configurations discussed.

As semiconductor fabrication technologies continue to advance, metal gate transistors have been used instead of polysilicon gate transistors to improve the performance of Integrated Circuit (IC) devices. The metal gate transistors employ a high-k material gate dielectric and a metal gate electrode. For the sake of facilitating the ensuing discussions, a diagrammatic fragmentary cross-sectional side view of a high-k metal gate device 35 is shown in FIG. 1 according to various aspects of the present disclosure.

Referring to FIG. 1, the high-k metal gate device 35 includes an N-type transistor 35A (N-type Metal Oxide Semiconductor Field Effect Transistor, or NMOS) and a P-type transistor 35B (P-type Metal Oxide Semiconductor Field Effect Transistor, or PMOS). The NMOS 35A and PMOS 35B are formed over a substrate 40. The substrate 40 is a silicon substrate doped with a P-type dopant such as boron (for example a P-type substrate). Alternatively, the substrate 40 could be another suitable semiconductor material. For example, the substrate 40 may be a silicon substrate that is doped with an N-type dopant such as phosphorous or arsenic (an N-type substrate). The substrate 40 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the substrate 40 could include an epitaxial layer (epi layer), may be strained for performance enhancement, and may include a silicon-on-insulator (SOI) structure.

Isolation structures 50 are formed in the substrate 40. In some embodiments, the isolation structures 50 include Shallow Trench Isolation (STI) features. The STI features are formed by etching recesses (or trenches) in the substrate 40 and filling the recesses with a dielectric material. In some embodiments, the dielectric material of the STI features includes silicon oxide. In alternative embodiments, the dielectric material of the STI features may include silicon nitride, silicon oxy-nitride, fluoride-doped silicate (FSG), and/or a low-k dielectric material known in the art. In yet other embodiments, the isolation structures 50 may include other types of isolation features such as such as Deep Trench Isolation (DTI) features.

A gate dielectric layer 100 is then formed over the interfacial layer. The gate dielectric layer 100 is formed by a chemical vapor deposition (CVD) process or an atomic layer deposition (ALD) process. In the illustrated embodiments, the gate dielectric layer 100 includes a high-k dielectric material. A high-k dielectric material is a material having a dielectric constant that is greater than a dielectric constant of SiO2, which is approximately 4. In an embodiment, the gate dielectric layer 100 includes hafnium oxide (HfO2), which has a dielectric constant that is in a range from approximately 18 to approximately 40. In alternative embodiments, the gate dielectric layer 100 may include one of ZrO2, Y2O3, La2O5, Gd2O5, TiO2, Ta2O5, HfErO, HfLaO, HfYO, HfGdO, HfAlO, HfZrO, HfTiO, HfTaO, and SrTiO. It is understood that an interfacial layer may be optionally formed between the substrate 40 and the gate dielectric layer 100. The interfacial layer may be formed by an ALD process and may include a dielectric material such as silicon oxide (SiO2).

A capping layer 110 is formed over the gate dielectric layer 100. The capping layer 110 may be formed by a deposition process such as CVD, physical vapor deposition (PVD), or ALD. The capping layer 110 prevents diffusion between the gate dielectric layer 100 and the metal layers thereabove. In some embodiments, the capping layer 110 contains titanium nitride.

The NMOS device 35A and the PMOS device 35B each include a respective metal gate electrode formed over the capping layer 110. The NMOS gate electrode includes a work function metal layer 120A, a blocking layer 130A, and a fill metal layer 140A. The PMOS gate electrode includes a work function metal layer 120B, a blocking layer 130B, and a fill metal layer 140B. The work function metal layers 120A-120B, the blocking layers 130A-130B, and the fill metal layers 140A-140B are each formed by one or more deposition processes such as CVD, PVD, ALD, or plating.

The work function metal layers 120A-120B are configured to tune a work function of its corresponding transistor to achieve a desired threshold voltage Vt. In some embodiments, the work function metal layer 120A contains one of: TiAl, TiAlN, or TaCN, or combinations thereof. In some embodiments, the work function metal layer 120B contains one of: TiN, WN, or W, or combinations thereof. In other embodiments, the work function metal layers 120A-120B may include other metal materials that are suitable for application or manufacturing considerations.

The blocking layers 130A-130B are configured to block or reduce diffusion between the layers therebelow (e.g., the work function metal layers 120A-120B) and the layers thereabove (e.g., the fill metal layers 140A-140B). In some embodiments, the blocking layer 130A and the blocking layer 130B each contain one of: TiN, TiON, TaN, TaON, or combinations thereof. The blocking layer 130A and the blocking layer 130B may have different thicknesses.

The fill metal layers 140A-140B are configured to serve as the main conductive portion of the NMOS and PMOS gate electrodes, respectively. In some embodiments, the fill metal layers 140A-140B each contain Aluminum (Al). In other embodiments, the fill metal layers 140A-140B may include contain other conductive materials such as Tungsten (W), Copper (Cu), or combinations thereof.

The metal gate electrodes of the NMOS device 35A and the PMOS device 35B may be formed by a gate replacement process. For example, using a gate-last approach, dummy polysilicon gate electrodes are first formed on a high-k gate dielectric layer. A plurality of ion implantation and/or diffusion processes are then performed to form source/drain regions of the transistors, followed by high temperature annealing processes to activate the source/drain regions. Thereafter, the dummy polysilicon gate electrodes are removed and replaced by the metal gate electrodes discussed above. Alternatively, in a high-k last approach (also considered a form of gate-replacement process), a dummy silicon oxide gate dielectric layer may be formed first. The rest of the steps for the high-k last approach are similar to the gate-last approach, except that the dummy silicon oxide gate dielectric layer is removed along with the removal of the dummy polysilicon gate electrodes. A high-k gate dielectric layer is then formed to replace the dummy silicon oxide gate dielectric layer, and then the metal gate electrodes are formed over the high-k gate dielectric layer.

Regardless of the specific approach used to form the high-k metal gate device, in many cases the NMOS and PMOS transistors are bordering each other (such as the NMOS and PMOS metal gate transistors 35A and 35B of FIG. 1). In other words, an N/P boundary 150 exists between these bordering NMOS and PMOS transistors. Since the NMOS and PMOS transistors 35A and 35B are intended to operate independently, metal diffusion across the boundary 150 may become a concern. This is because such diffusion may affect the threshold voltage of these transistors.

An example diffusion path 160 is shown in FIG. 1, which illustrates that the metal material (e.g., Aluminum) from the fill metal layer 140A may diffuse across the N/P boundary 150 and to the PMOS transistor. This diffusion is likely to occur, because the NMOS blocking layer 130A is quite narrow/thin, particularly near the corner between the fill metal layer 140A and the N/P boundary 150. Consequently, the NMOS blocking layer 130A may not be able to effectively block or prevent diffusion due to its narrowness. The capping layer 110 of the PMOS transistor 35B will thus be contaminated, which results in a higher threshold voltage Vt for the PMOS transistor 35B compared to PMOS transistors without an N/P boundary (i.e., a PMOS transistor not bordering an NMOS transistor). This may be referred to as a boundary effect.

The boundary effect is exacerbated as semiconductor devices continue to be scaled down. For example, a distance 160 between the N/P boundary 150 and an active region (e.g., source/drain region) of the PMOS transistor may shrink as part of the scaling down process. Therefore, the diffusion path 160 may shrink as well, thereby facilitating the undesirable diffusion across the N/P boundary 150 and the contamination of the PMOS transistor 35B.

It is noted that the diffusion from the PMOS transistor 35B to the NMOS transistor 35A is not as much of a concern, partially because the blocking layer 130B for the PMOS transistor is much thicker (and therefore more capable of preventing diffusion), and also partially because the fill metal layer 140B of the PMOS transistor 35B is located farther away from the N/P boundary 150 (and therefore lengthening the diffusion path). Thus, the unintended threshold voltage shift for the PMOS transistor 35B is of more concern.

Figure 2:
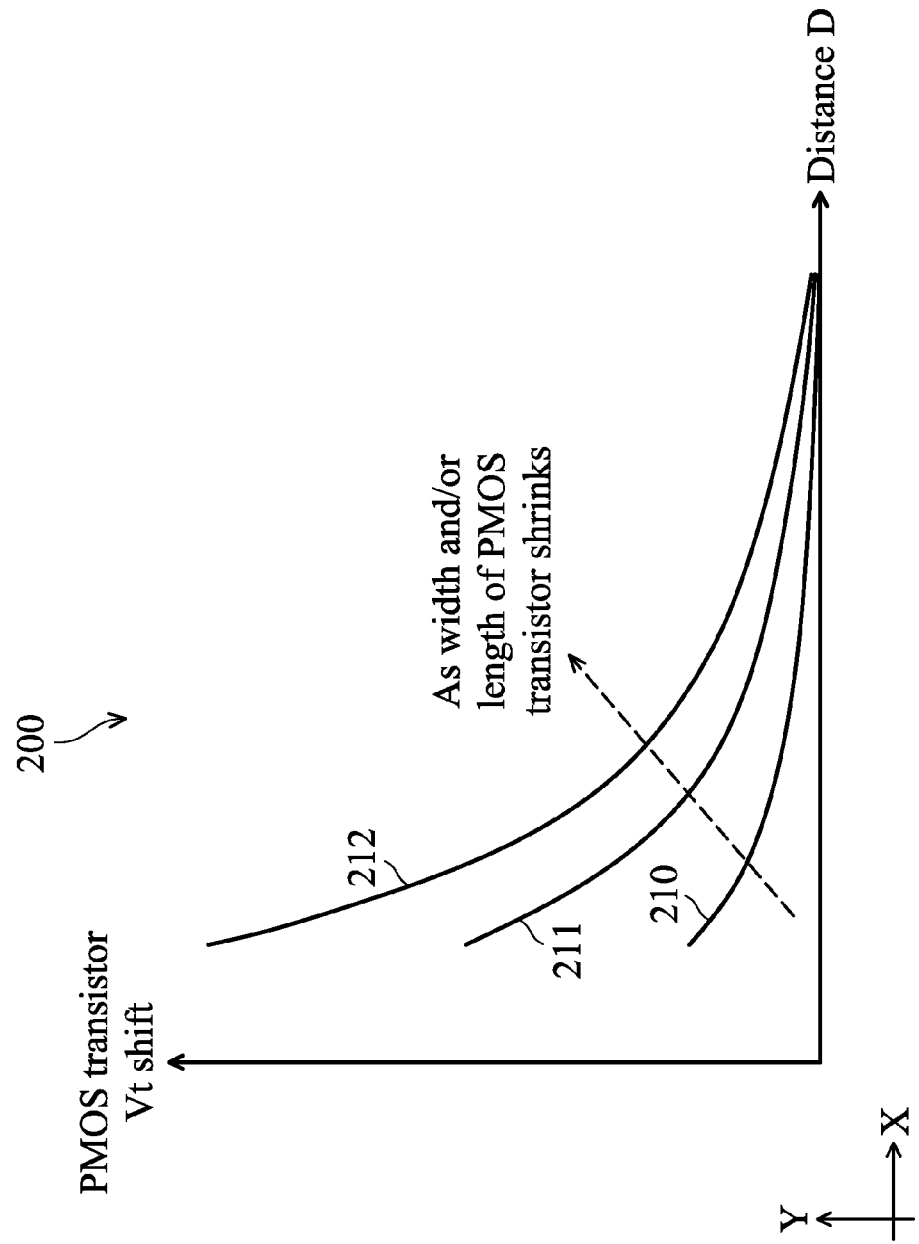
FIG. 2 is a graph illustrating a relationship between a threshold voltage shift versus a distance between an active region and an N/P boundary.

FIG. 2 is a graph 200 that illustrates the relationship between the threshold voltage shift and various other factors such as transistor device size and distance between the N/P boundary and the PMOS active region. Referring to FIG. 2, the graph 200 includes an X-axis and a Y-axis that is perpendicular to the X-axis. The X-axis represent the distance (e.g., the distance 160 of FIG. 1) between an N/P boundary and the PMOS active region, denoted herein as distance "D". The Y-axis represents the amount of shift in the threshold voltage Vt of the PMOS transistor (e.g., the PMOS transistor 35B).

The graph 200 contains a plurality of curves 210-212 that represent plots of the threshold voltage Vt versus the distance D. It can be seen that as the distance D increases, the amount of threshold voltage shift is reduced. In other words, a larger distance D is desired, since it corresponds to a minimal amount of threshold voltage shift. On the other hand, a small distance D causes a large amount of threshold voltage shift, which is undesirable.

Meanwhile, the width and length of the PMOS transistor also affects the threshold voltage shift. The dashed line in FIG. 2 indicates the direction in which the curves 210-212 move as the width and/or length of the PMOS transistor decreases. For example, the curve 212 represents a PMOS transistor having smaller width and/or length than that of the PMOS transistor represented by the curve 211, and the curve 211 represents a PMOS transistor having smaller width and/or length than that of the PMOS transistor represented by the curve 210. As such, at any given fixed distance D, the curve 212 has the greatest amount of threshold voltage shift (undesirable), the curve 211 has an intermediate amount of threshold voltage shift (less undesirable), and the curve 210 has the least amount of threshold voltage shift (more desirable).

Thus, based on the relationships indicated in FIG. 2, it can be seen that in order to minimize the amount of threshold voltage shift, the distance D between an N/P boundary and the PMOS active region should be maximized, and the width and length of the PMOS transistor should be maximized as well. However, the trend in modern semiconductor fabrication is the continued scaling down process—continued reductions of semiconductor feature dimensions. Thus, since it is not always feasible to maximize the distance D or the width and length of transistors, it is important to ensure that the various feature sizes do not experience unintentional variations as part of the fabrication process, because these variations may lead to severe degradations in uniformity (for example, threshold voltage uniformity).

Unfortunately, limitations in current lithography technology may cause these undesirable variations. For example, a line-end rounding effect in a lithography process may unintentionally reduce the size of a PMOS metal gate transistor, and/or reduce the distance between the N/P boundary and the PMOS active region. To avoid these problems, a method of fabricating metal gate transistors is discussed below with reference to FIGS. 3-9. In more detail, FIGS. 3-4 and 6-9 are diagrammatic fragmentary top views of a portion of a semiconductor wafer at various stages of fabrication according to some embodiments of the present disclosure, and FIG. 5 includes diagrammatic top views of various layout patterns.

Figure 3:
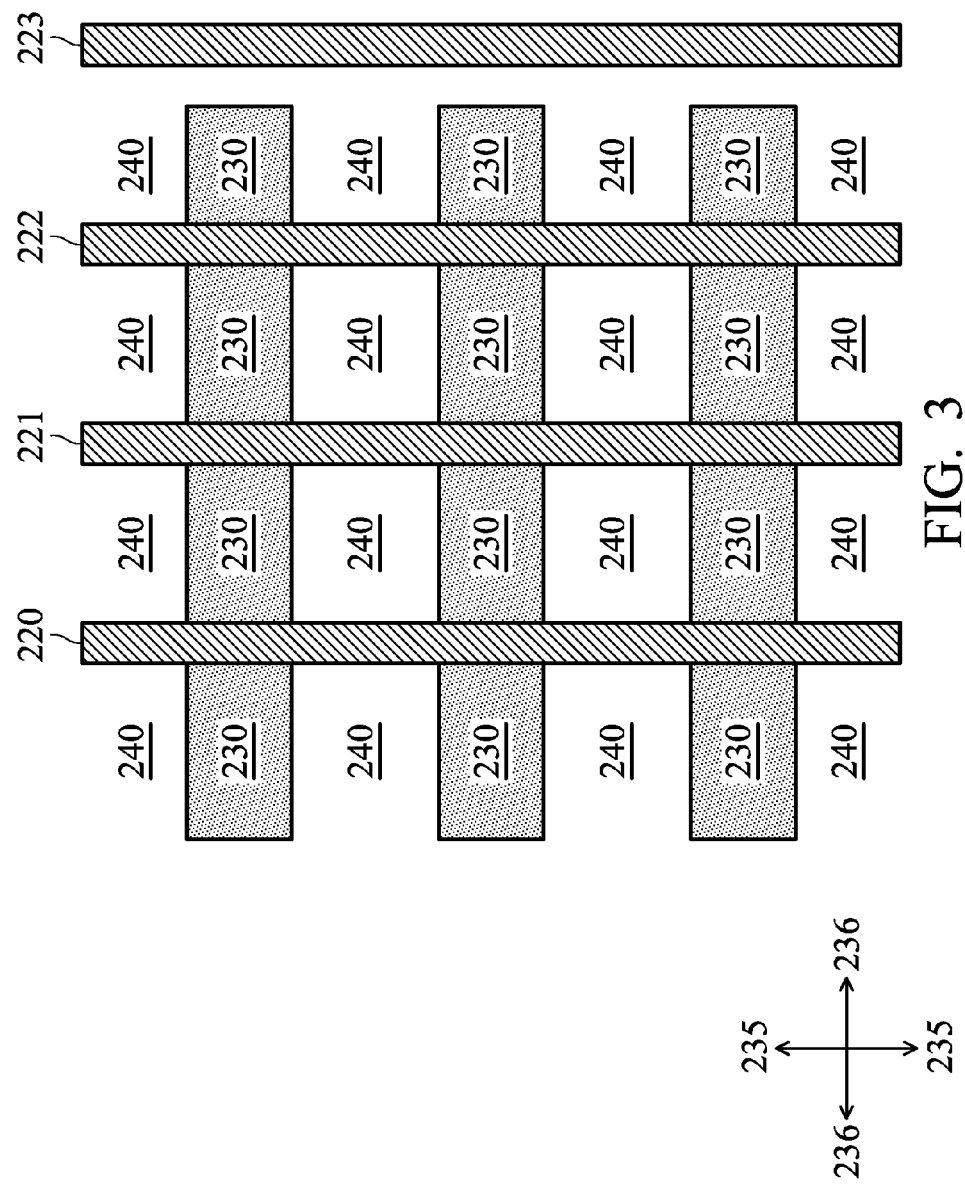
FIGS. 3-4 and 6-9 are diagrammatic top view of a semiconductor device at various stages of fabrication according to the various aspects of the present disclosure.

Referring to FIG. 3, the wafer includes a substrate. The substrate may be similar to the substrate 40 of FIG. 1, and may be doped and may contain a plurality of isolation structures. The wafer also includes a plurality of gates, four of which are illustrated herein as gates 220-223. The gates 220-223 illustrated herein have elongate rectangular shapes, and as such they may also be referred to as gate strips or gate lines 220-223. In the illustrated embodiments, the gate lines 220-223 are dummy gate electrodes and include a polysilicon material. Although not shown in the top view of FIG. 3, it is understood that each of the gate lines 220-223 may have a gate dielectric layer formed therebelow. The gate dielectric layer may contain a high-k material.

The wafer includes active regions 230. The active regions may include lightly-doped source/drain regions and heavily-doped source/drain regions. These lightly-doped source/drain regions and heavily-doped source/drain regions may each be formed by a plurality of ion implantation processes and diffusion processes. The formation of these regions may be performed using a plurality of patterning processes. The gate lines 220-223 may be used as patterning masks during these patterning processes.

In the illustrated embodiments, the gate lines 220-223 have elongate shapes and extend in a direction 235. In comparison, the active regions 230 extend in a direction 236, which is different from the direction 235. In some embodiments, the directions 235 and 236 are substantially perpendicular or orthogonal to each other.

The wafer also includes an interlayer (or interlevel) dielectric (ILD) layer 240 formed between the gate lines 220-223. The ILD layer 240 contains a dielectric material, such as silicon oxide, silicon nitride, silicon oxynitride, or a low-k material. At the stage of fabrication shown in FIG. 3, the ILD layer 240 has been formed and polished by a polishing process (e.g., a chemical-mechanical-polishing process) to have a planarized surface with the gate lines 220-223.

Figure 4:
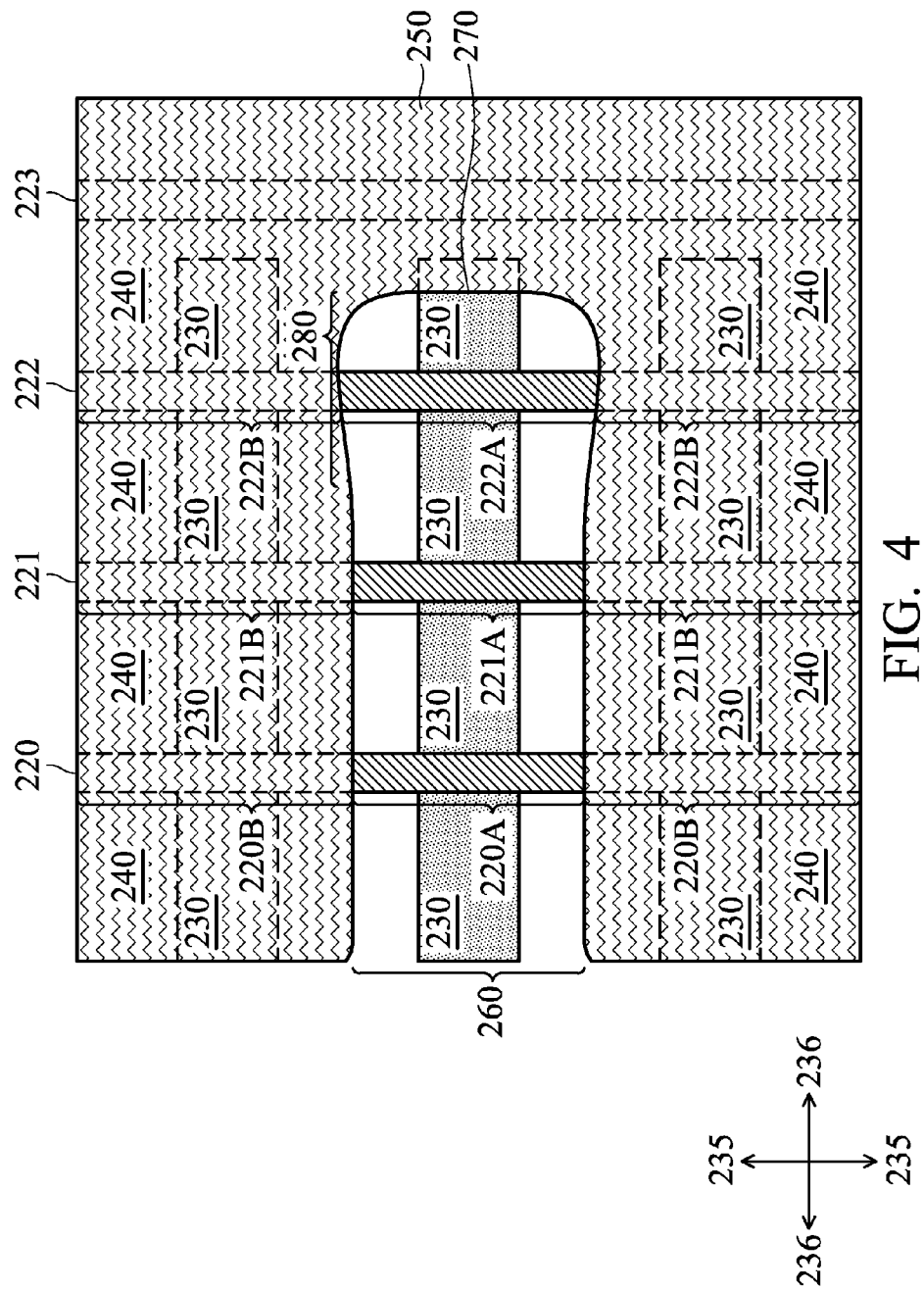

Referring now to FIG. 4, a patterned mask 250 is formed over the wafer. In some embodiments, the patterned mask 250 includes a photoresist mask. In other embodiments, the patterned mask 250 may include a hard mask. The patterned mask 250 is formed by a lithography process, which may involve one or more masking, exposing, baking, rinsing, and etching processes (not necessarily in that order).

The patterned mask 250 defines a contour (or an opening) 260. The contour 260 has an elongate shape and extends along the direction 236 (same direction as the active region 230 but perpendicular to that of the gate lines 220-223). The contour 260 divides each of the gate lines 220-222 into two segments or portions: segments 220A-222A that are exposed by (or disposed within) the contour 260 and segments 220B-222B that are disposed outside of the contour 260 (or covered by the mask 250). Eventually, the exposed segments 220A-222A will each be replaced by one type of metal gate (e.g., a PMOS gate), while the covered segments 220B-222B will each be replaced by another type of metal gate (e.g., an NMOS gate). This will be discussed in more detail later.

Still referring to FIG. 4, among the exposed segments, the segment 222A may be considered an edge segment or outermost segment, since it is located closest to an edge or tip 270 of the contour 260. Note that the contour 260 has another edge or tip opposite the tip 270, but since FIG. 4 is a fragmentary view, the contour 260 is only partially illustrated herein, and the other edge or tip is not illustrated. Alternatively stated, the contour 260 may be viewed as having a tip portion 280, which includes (but is not limited to) a portion of the contour 260 located near the tip 270 of the contour 260. The outer-most segment 222A is exposed by (and disposed within) the tip portion 280 of the contour 260. The interfaces between the segments 222A and 222B coincides with the boundaries of the tip portion 280.

As illustrated, the tip portion 280 of the contour 260 is wider (measured in the direction 235) than the rest of the contour 260. This is done to ensure that the outer-most segment 222A is longer (also measured in the direction 235) than the rest of the segments 220A-221A. This configuration helps reduce the threshold voltage shift, which will be discussed in more detail below. In some embodiments, the shape of the contour 260 (i.e., the wider tip portion 280) is obtained using an Optical Correction Proximity (OPC) technique. In more detail, refer to FIGS. 5A-5D, where FIGS. 5A and 5C-5D are diagrammatic top views of layout plans, and FIG. 5B is a top view of an example semiconductor device corresponding to the top view of the layout plan illustrated in FIG. 5A.

Figure 5A:
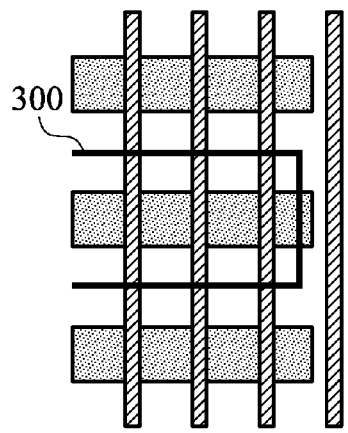
FIGS. 5A and 5C-5D are top views of example layout patterns.
Figure 5B:
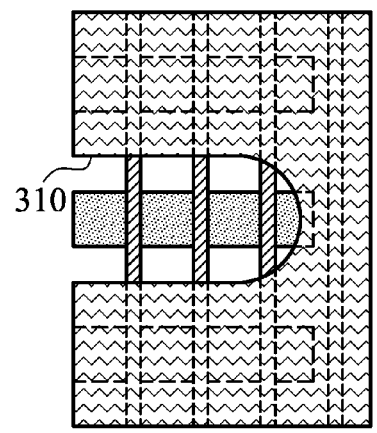
FIG. 5B is a top view of an actually fabricated pattern.
Figure 5C:
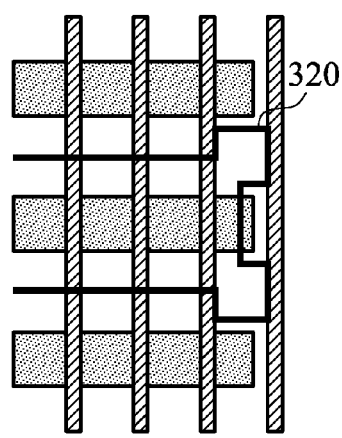
Figure 5D:
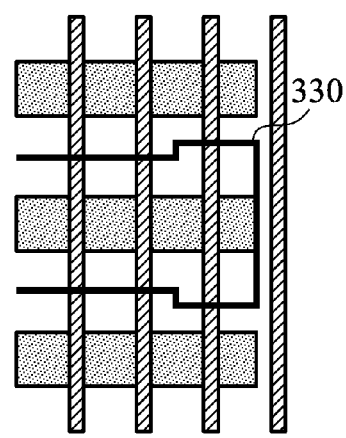

In FIG. 5A, a rectangular layout contour 300 may delineate the intended boundaries of a mask layer, for example the mask 250 of FIG. 4. The shape and geometries of the layout contour may be transferred to a corresponding photomask (not illustrated herein). Ideally, the rectangular shape of the layout contour 300 will be preserved during a subsequent lithography process, so that the formed mask will also demonstrate the shape of the layout contour 300. However, due to current lithography limitations, a line-end rounding effect may occur, which will form a mask having a contour 310 as shown in FIG. 5B. In more detail, the tip of the formed contour 310 is rounded or curved, as opposed to being rectangular as intended. If this were to happen to the contour 260 of FIG. 4, the segment 222A would have been shorter than the rest of the segments 220A-221A located away from the tip portion 280 of the contour 260. As discussed above, the segments 220A-222A and 220B-222B will eventually be replaced by metal gates. For reasons similar to those discussed above with reference to FIGS. 1-2, a shorter metal gate (corresponding to a shortened segment 222A) will have detrimental threshold voltage shift effects. Hence, the traditional approach of using a rectangular layout contour to form a desired rectangular contour may not be feasible.

In comparison, according to the various aspects of the present disclosure, an OPC technique is used to overcome the issues discussed above. The OPC technique employs assistant features to "help" the actual contour achieve a desired shape. FIGS. 5C and 5D illustrate two example assistant features: a serif assistant feature 320 in FIG. 5C and a hammerhead assistant feature 330 in FIG. 5D. These assistant features 320-330 of FIGS. 5C-5D can effectively minimize the line-end rounding effect of the fabricated mask contour. In the embodiments disclosed herein, assistant features similar to those shown in FIGS. 5C and 5D may be used and further configured to ensure that the tip portion 280 of the contour 260 does not suffer from the line-end rounding effect. In fact, the assistant features used in the OPC process herein help ensure that the tip portion 280 has a greater width than the rest of the contour 260. In this manner, the length of the segment 222A is formed to be at least as long as the rest of the segments 220A-221A.

Figure 6:
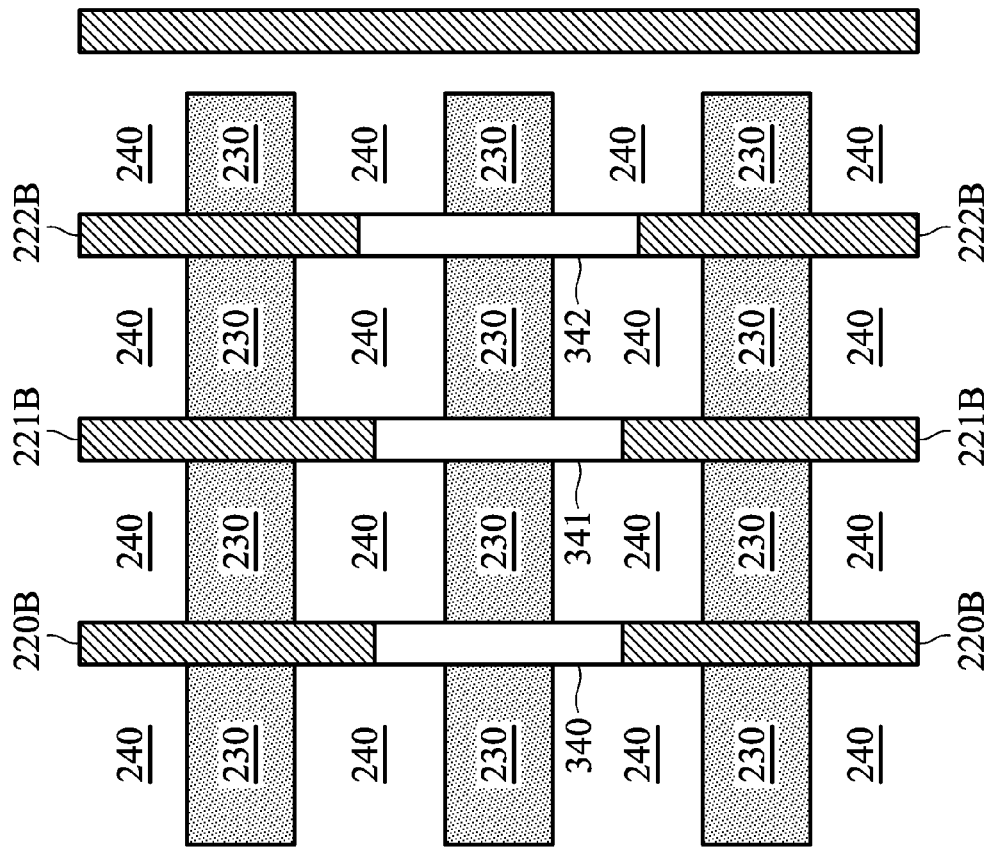

Referring now to FIG. 6, the segments 220A-222A are removed, thereby forming openings 340-342, respectively. The segments 220A-222A may be removed by an etching process, where the patterned mask 250 is used as an etching mask. Thereafter, the patterned mask 250 is removed through a suitable process such as an ashing process or a stripping process.

Figure 7:
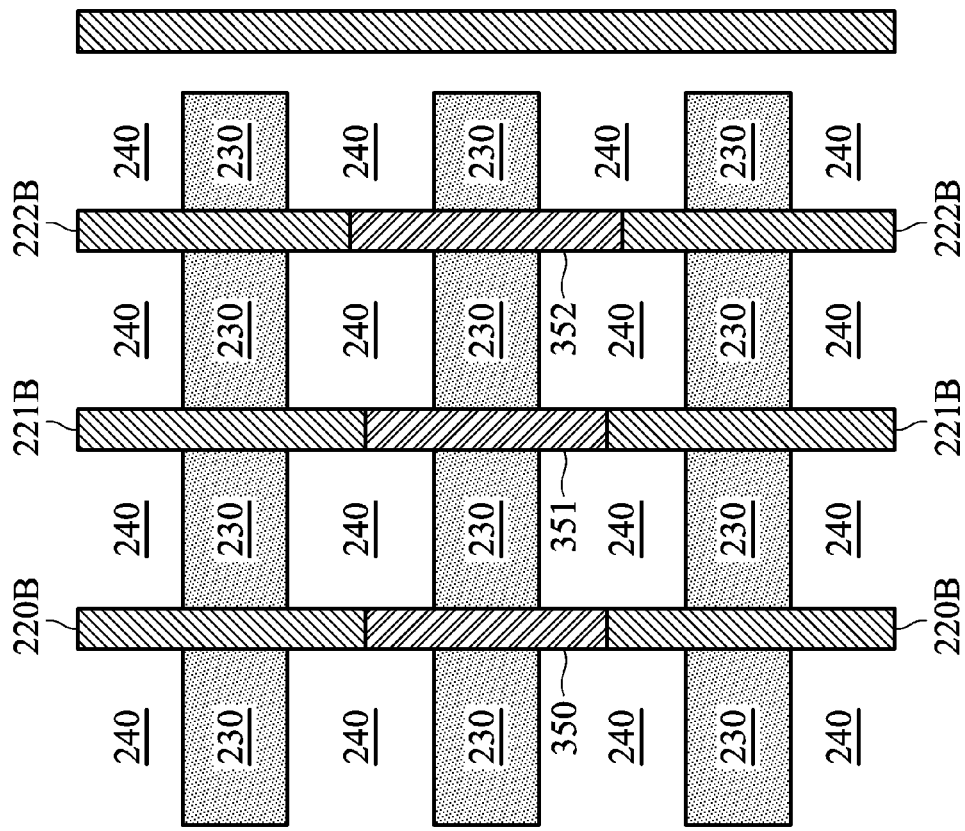

Referring now to FIG. 7, metal gates 350-352 are formed in the openings 340-342, respectively. In the embodiments illustrated, the metal gates 350-352 are P-type metal gates, similar to the metal gate of the PMOS transistor 35B of FIG. 1. Thus, the metal gates 350-352 each include a P-type work function metal, similar to the work function layer 120B of FIG. 1. The metal gates 350-352 may be formed by one or more deposition processes known in the art. Following the deposition processes, a polishing process such as a CMP process may be performed to planarize the surface of the metal gates 350-352.

Figure 8:
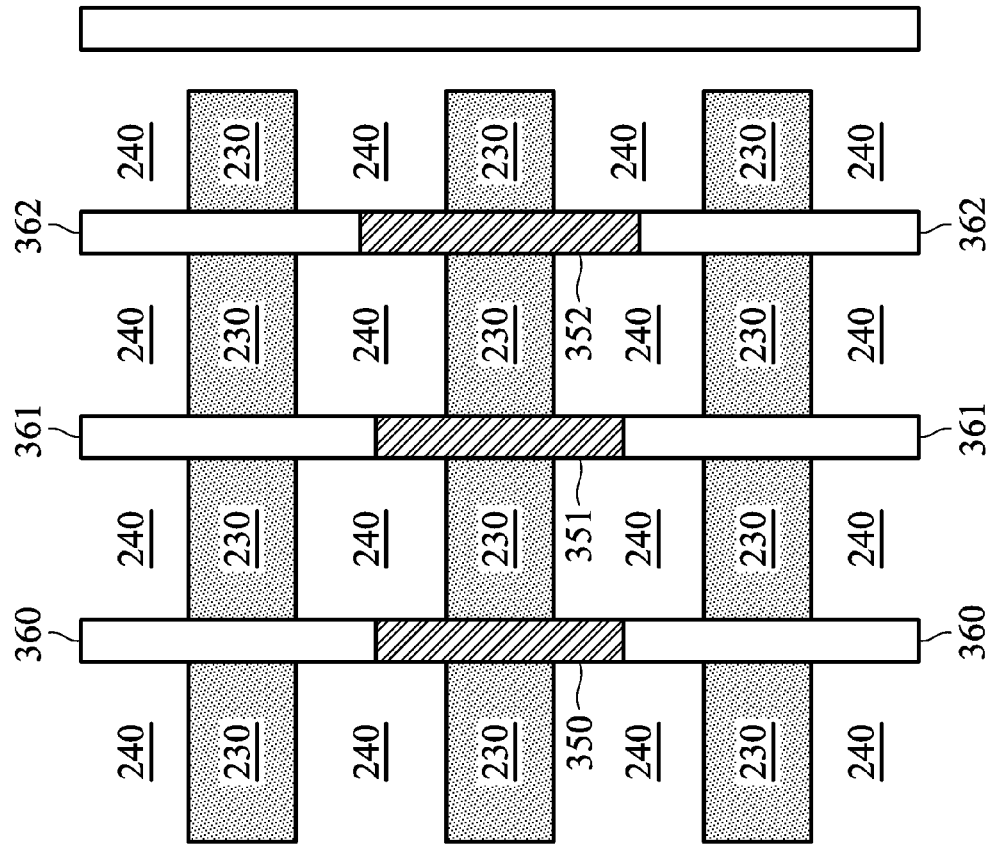

Referring now to FIG. 8, the segments 220B-222B of the dummy gates are removed, thereby forming openings 360-362. The removal of the segments 220B-222B may be carried out using an etching process. Meanwhile, the metal gates 350-352 still remain after the segments 220B-222B are removed.

Figure 9:
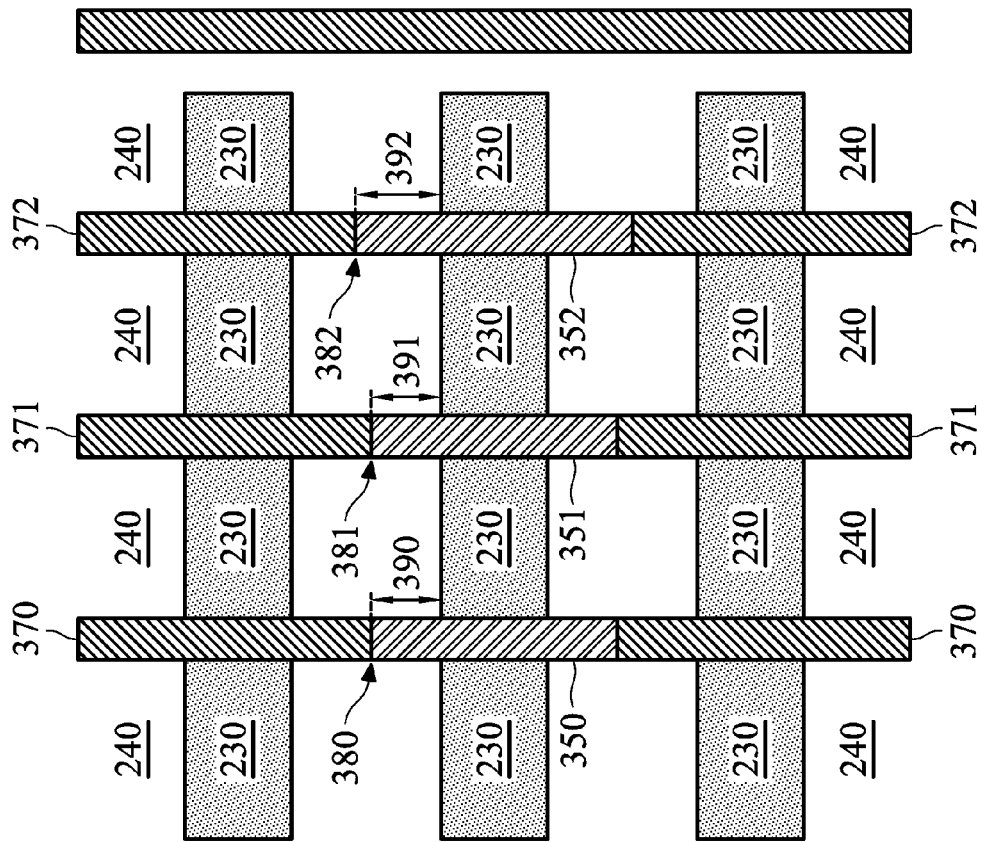

Referring now to FIG. 9, metal gates 370-372 are formed in the openings 360-362, respectively. In the embodiments illustrated, the metal gates 370-372 are N-type metal gates, similar to the metal gate of the NMOS transistor 35A of FIG. 1. Thus, the metal gates 370-372 each include an N-type work function metal, similar to the work function layer 120A of FIG. 1. The metal gates 370-372 may be formed by one or more deposition processes known in the art. Following the deposition processes, a polishing process such as a CMP process may be performed to planarize the surface of the metal gates 370-372. At this stage of fabrication, the dummy polysilicon gates 220-222 have been replaced by the metal gates 350-352 and 370-372.

N/P boundaries 380-382 are formed between the metal gates 350-352 and the metal gates 370-372, respectively. Similar to the N/P boundary 150, the N/P boundaries 380-382 represent the boundaries or interfaces between PMOS transistor gates and NMOS transistor gates. Distances 390-392 separate the N/P boundaries 380-382 from the edge of the active region 230 underneath (or intersecting with) the metal gates 350-352, respectively. In a cross-sectional view, the distances 390-392 each correspond to the distance 160 of FIG. 1. The active region 230 underneath the metal gates 350-353 is a P-type doped active region in the illustrated embodiments.

Metal diffusion across these boundaries 380-382 is undesirable and therefore should be minimized. In particular, diffusion from the NMOS transistor gates (corresponding to metal gates 370-372 herein) to the PMOS transistor gates (corresponding to metal gates 350-352) is more likely to occur, and therefore is of greater concern. According to the various aspects of the present disclosure, the distances 390-392 should be optimized. The optimization of the distances involves avoiding having one of the distances 390-392 being significantly shorter than the rest. Had a traditional patterning process been used to form the metal gates 350-352, the line-end rounding effect may occur, which would likely result in the distance 392 being shorter than the distances 390-391. This is undesirable, since as discussed above with reference to FIGS. 1-2, such short distance between the N/P boundary and the active region would increase the amount of threshold voltage variation for the transistor corresponding to the metal gates 352 and 372 (i.e., the outer-most transistor).

In comparison, the present disclosure utilizes an OPC technique to form metal gates 350-352 such that the outer-most metal gate 352 is longer than the rest of the metal gates 350-351. In other words, the distance 392 is greater than the distances 390-391. In some embodiments, a ratio of the distance 392 to the distances 390 or 391 is greater than 1:1 but less than 1.5:1. Having a greater distance 392 than the distances 390-391 does not tend to adversely impact the threshold voltage, because as FIG. 2 shows, as the distance D increases, the amount of threshold voltage shift decreases (e.g., approaching zero eventually). This is because as the distance between the N/P boundary and the active region increases, it becomes harder and harder for undesirable diffusion across the N/P boundary to occur. Therefore, the present disclosure offers the benefit of reducing the amount of threshold voltage shift.

It is understood that additional processes may be performed to complete the fabrication of the high-k metal gate semiconductor device. For example, these additional processes may include deposition of passivation layers, formation of contacts, and formation of interconnect structures (e.g., lines and vias, metal layers, and interlayer dielectric that provide electrical interconnection to the device including the formed metal gate). For the sake of simplicity, these additional processes are not described herein.

The embodiments discussed above with reference to FIGS. 3-9 illustrate a "gate last" approach of a gate replacement fabrication process. It is understood that the various aspects of the present disclosure may also apply to a "high-k last" approach of the gate replacement process. In the high-k last process, a silicon oxide gate dielectric layer is formed first instead of a high-k dielectric gate dielectric. The oxide gate dielectric layer in the high-k last process also serves as a dummy layer and will be removed later along with the dummy polysilicon gate electrodes. A high-k dielectric layer may then be formed to replace the dummy silicon oxide gate dielectric layer. It is understood that the aspects of the present disclosure may apply to both a gate-last approach or a high-k last approach.

In addition, though the embodiments discussed above illustrate a process in which the PMOS metal gates are formed first, it is understood that NMOS metal gates may be formed first in alternative embodiments. For example, whereas the mask layer 250 may contain a positive photoresist, a negative photoresist mask may be employed, such that the contour 260 may protect the dummy polysilicon gates therebelow instead of exposing them. The dummy gate segments outside the contour may be removed and replaced with NMOS metal gates, and subsequently the PMOS metal gates may be formed. Once again, the aspects of the present disclosure may apply regardless of whether the PMOS gates are formed first or the NMOS gates are formed first.

Figure 10:
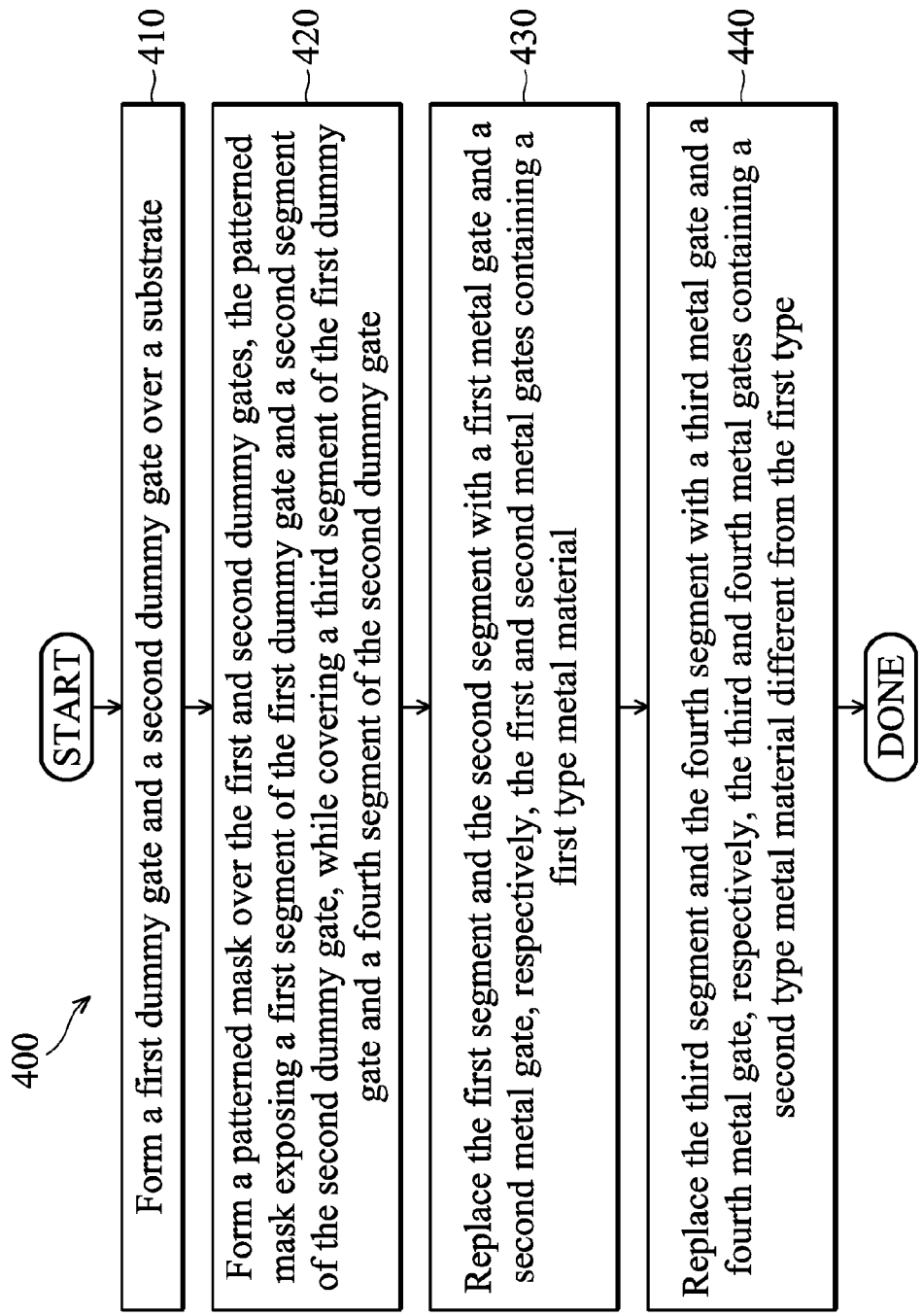
FIG. 10 is a flowchart illustrating a method of fabricating a semiconductor device according to various aspects of the present disclosure.

FIG. 10 is a method 400 of fabricating a semiconductor device according to various aspects of the present disclosure. Referring to FIG. 10, the method 400 includes a block 410, in which a first dummy gate and a second dummy gate are formed over a substrate. In some embodiments, the first and second dummy gates each include a dummy polysilicon gate electrode. The method 400 includes a block 420, in which a patterned mask is formed over the first and second dummy gates. The patterned mask exposes a first segment of the first dummy gate and a second segment of the second dummy gate, while covering a third segment of the first dummy gate and a fourth segment of the second dummy gate. The mask is formed in a manner such that the first and second segments have significantly different lengths. The method 400 includes a block 430, in which the first segment and the second segment are replaced with a first metal gate and a second metal gate, respectively. The first and second metal gates contain a first type metal material. The method 400 includes a block 440, in which the third segment and the fourth segment are replaced with a third metal gate and a fourth metal gate, respectively. The third and fourth metal gates contain a second type metal material different from the first type.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiment. One advantage is that the N/P boundary effect can be suppressed. Using an OPC technique, the distance between the N/P boundary and the active region for an outer-most metal gate can be lengthened to be as great as the other distances between the active region and other metal gates. Thus, the threshold voltage shift is significantly reduced. Another advantage is that the process of the present disclosure is fully compatible with existing process flow, and thus no additional fabrication process (or related fabrication equipment) is needed. Therefore, the present disclosure requires no extra fabrication costs. Yet one more advantage is that the customers designing the layout of the ICs need not revise their original layout designs, since the OPC features can be added and implemented by a foundry during fabrication.

In addition to the N/P boundary effect reduction discussed above, the present disclosure also utilizes layout modification to improve device performance in various other ways, as discussed in more detail below.

Figure 11A:
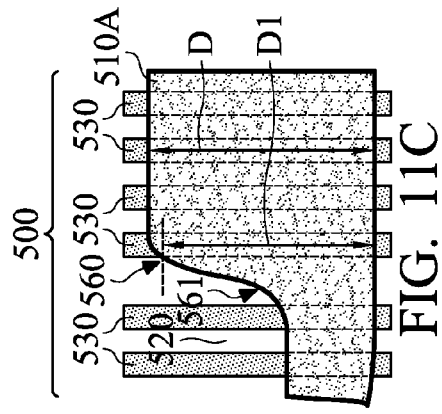
FIGS. 11A-11F are simplified diagrammatic top views of a semiconductor device according to some embodiments of the present disclosure.

FIGS. 11A-11F are various simplified conceptual top views of a portion of a semiconductor device 500 at various stages of fabrication. Referring to FIG. 11A, a simplified diagrammatic original layout design of the portion of the semiconductor device 500 is illustrated. According to the original layout design, the portion of the semiconductor device 500 includes an active region (also referred to as an OD region) 510, an isolation region 520 (e.g., shallow trench isolation or STI), and a plurality of gate lines 530 (e.g., polysilicon gate lines) overlying portions of the active region 510 and the isolation region 520. The active region 510 has one or more rectangular subsections, which include corners 540-541. As is shown in FIG. 11A, the corner 540-541 have sharp angles, for example an angle that is approximately 90 degrees.

Figure 11B:
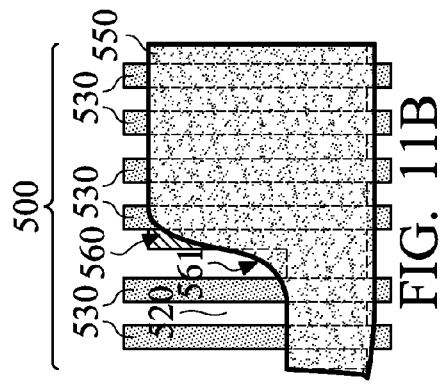

Referring now to FIG. 11B, a simplified diagrammatic top view of the portion of the semiconductor device 500 is illustrated. At the stage of fabrication shown in FIG. 11B, a photoresist layer 550 is formed to define the active region 510. In other words, the photoresist layer 550 should have been formed to have approximately the same geometries as the active region 510 shown in the original layout design of FIG. 11A, so that the photoresist layer 550 may be used in a later patterning process to accurately define the active region 510 as intended. However, due to various photolithography effects, the photoresist layer 550 as formed does not accurately resemble the active region 510 in the original layout design as shown in FIG. 11A. For example, the photoresist layer 550 as formed has rounded corners 560-561, rather than the sharp corners 540-541 in the original layout design. In more detail, the rounded corner 560 slopes inward, whereas the rounded corner 561 sloped outward.

It is understood that the gate lines 530 may not be formed at this stage of fabrication yet, but they are conceptually illustrated herein to provide a better understanding of the present disclosure.

Figure 11C:
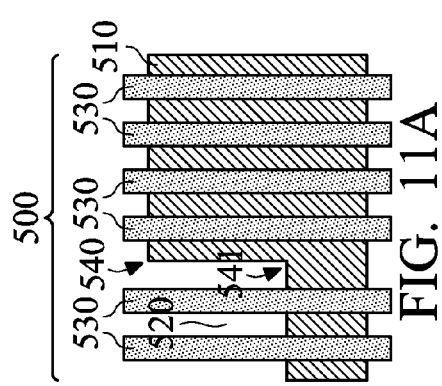

Referring now to FIG. 11C, if the rounded corners 560-561 are not corrected, the photoresist layer 550 will end up defining an active region 510A that approximately resembles the shape and size of the photoresist layer 550. As such, the active region 510A will also have the rounded corners 560-561 that were present in the photoresist layer 550. The gate lines 530 may be formed in a later fabrication process. Due to the rounded corners 560-561 of the active region 510A, the portions of the gate lines 530 overlapping with the active region 510A will have different lengths. For example, the gate line 530 overlapping with the portion of the active region 510A near the rounded corner 560 will have a length D1 (vertical dimension as shown herein), whereas another gate line 530 overlapping with the portion of the active region 510A away from the rounded corner 560 will have a length D (vertical dimension as shown herein). It may be said that the length D is the intended length for D1.

However, as is shown in FIG. 11C, D1 is smaller than D. Again, had the rounded corners 560-561 not been present, D1 would have been approximately equal to D. In other words, the rounding effect caused by the photolithography process may shorten the length of the gate line that overlaps with a portion of the active region 510 near the rounded corners 560-561. Since the overlap between the gate lines 530 and the active region 510A represents the channel regions of the semiconductor device 500, the rounding effect unnecessarily shortens the channel region near the rounded corners of the active region 510A. The shortened channel region may adversely impact device performance and is therefore undesirable.

Figure 11D:
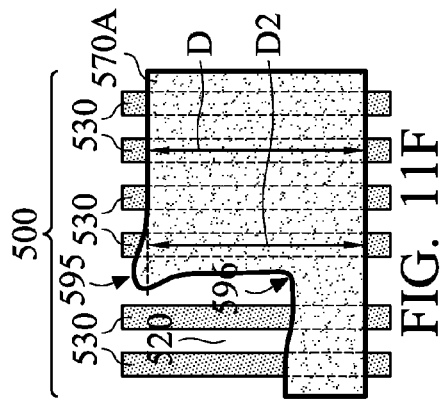

Referring now to FIG. 11D, a simplified top view of a revised layout design is illustrated for the portion of the semiconductor device 500 having a revised active region 570. In the revised layout design, the gate lines 530 may remain substantially the same as they were in the original layout design. However, the design for the active region 570 is modified (from the original design shown in FIG. 11A) to compensate for the corner rounding effect discussed above. For example, an optical proximity correction (OPC) process may be utilized to correct image errors (e.g., the rounded corners) by modifying the original design layout. The OPC process may be model-based, rule-based OPC, table-based OPC, or combinations thereof. In various embodiments, the OPC process may include moving edges of a main feature and adding assist features to the main feature, or resizing, repositioning, and/or reshaping the main feature. In addition, various assist features, such as scattering bars, serifs or hammerheads may also be added to the main feature. The assist features may be placed a distance away from the main feature (such as scattering bars) or may be placed adjacent to the main feature (such as serifs and hammerheads).

In the example discussed herein, the active region 510 may be considered a main feature, and thus it may be resized, repositioned, reshaped, or have various assist features added thereto/or subtracted therefrom in various manners to alleviate the impact of the corner rounding effect. In the embodiment shown in FIG. 11D, an assist feature 580 is added to the original layout of the active region 510. Meanwhile, the original layout of the active region 510 is also revised to have a recess 581. The addition of the assist feature 580 makes the original corner 540 of the active region 510 more "convex" (i.e., protruding outward more), which should help offset against the rounded corner 560 (FIG. 11B) being sloped inward. Similarly, the subtraction of an area of the active region 510 to create the recess 581 makes the original corner 541 of the active region 510 more "concave" (i.e., protruding inward more), which should help offset against the rounded corner 561 (FIG. 11B) being sloped outward.

Figure 11E:
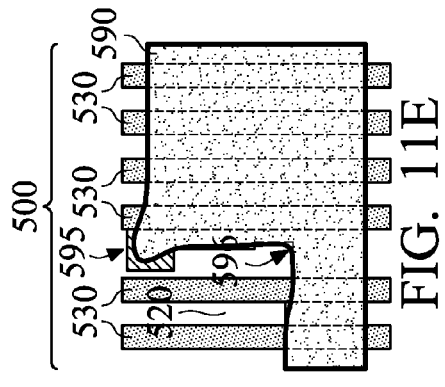

Referring now to FIG. 11E, a simplified diagrammatic top view of the portion of the semiconductor device 500 is illustrated. At the stage of fabrication shown in FIG. 11E, a photoresist layer 590 is formed to define the revised active region 570. Again, the various photolithography effects will make the actual shape and geometry of the formed photoresist layer 590 differ from the active region 570 in the revised layout design. As discussed above, the rounding effect will make the corner 540 (FIG. 11A) slope inward and the corner 541 (FIG. 11A) sloped outward. However, due to the presence of the assist feature 580 as well as the recess 581 (i.e., subtraction from the active region 570) as shown in FIG. 11D, the as-formed photoresist layer 590 now has corners 595 and 596. The corner 595 may protrude outward somewhat from the active region, whereas the corner 596 may protrude inward somewhat from the active region, but the degree of protrusion (whether inward or outward) is less pronounced than the corners 560-561.

Figure 11F:
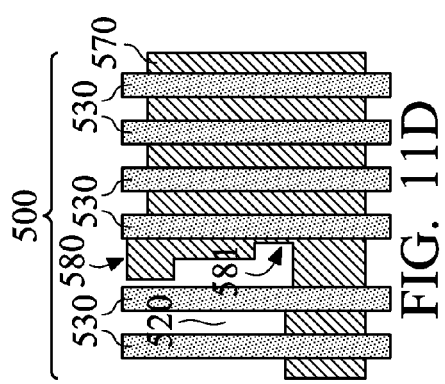

Referring now to FIG. 11F, a simplified diagrammatic top view of the portion of the semiconductor device 500 is illustrated after the photoresist layer 590 defines an active region 570A, which approximately resembles the shape and size of the photoresist layer 590. As such, the active region 570A will also have the corners 595-596 that were present in the photoresist layer 590. It can be seen that the gate line 530 overlapping with the portion of the active region 570A near the corner 595 will have a length D2 (vertical dimension as shown herein), whereas the gate line 530 overlapping with the portion of the active region 570A away from the rounded corner 595 still has a length D, as it did in FIG. 11C.

As is shown here, the revised active region 570A results in a D2 that is approximately the same length as D. Thus, the channel associated with D2 is no longer shorter than it is meant to be. Stated differently, the negative effects caused by the corner rounding are substantially reduced or eliminated by the design changes to the revised layout design for the active region 570 (as shown in FIG. 11D). The actually formed active region 570A can better approximate the geometric characteristics of the active region 510 of the original layout, though they are not identical. For example, the corners 540-541 are sharp (e.g., 90 degree angles) according to the original layout design of the active region 510 as shown in FIG. 11A. In comparison, the corners 595-596 of the actually formed active region 570A may have more curvature (more rounded). The added-curvature herein is actually beneficial because it reduces stress-induced cracking that may result from sharp angles such as 90 degree angles for the corners of active regions. Again, the roundness of the corners is not the problem, the problem is the fact that the corner rounding effect causes the channel length to shrink, which has been corrected by the revised layout design discussed above.

It is also understood that the ripple or wavelike edge between the corners 595-596 as shown in FIG. 11F is not important. In other embodiments, this edge between the corners 595-596 may be free of ripples and may assume any other suitable form. In addition, it is understood that the modification of the active region 570 (i.e., by the addition of the assist feature 580 and the removal of a portion of the active region 570 to result in the recess 581) as shown in FIG. 11D is merely an example. In other embodiments, different types of OPC processes may be performed to achieve the shape and profile of the active region 570A as shown in FIG. 11F, which is a better approximation (but minus the harmful consequences of sharp corners) of the active region 510 according to its original layout design than if no OPC process was performed.

Figure 12A:
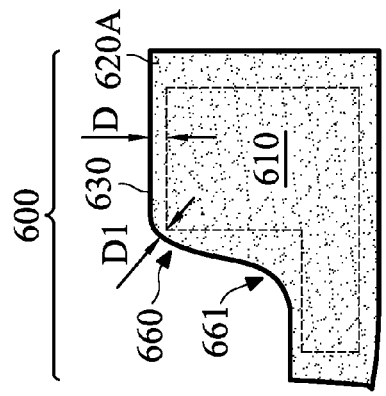
FIGS. 12A-12F are simplified diagrammatic top views of a semiconductor device according to some embodiments of the present disclosure.

FIGS. 12A-12F are various simplified conceptual top views of a portion of a semiconductor device 600 at various stages of fabrication. Referring to FIG. 12A, a simplified diagrammatic original layout design of the portion of the semiconductor device 600 is illustrated. According to the original layout design, the portion of the semiconductor device 600 includes an active region (also referred to as an OD region) 610, a doped region 620, and a doped region 625. The active region 610 may be considered to be an active region of (or within) the doped region 620. One of the doped regions 620 and 625 is N-doped, while the other one of the doped regions 620 and 625 is P-doped. The doped regions 620 and 625 form an interface or boundary 630 therebetween. Since the doped regions 620 and 625 have different types of conductivity (i.e., one is N-doped while the other is P-doped), the boundary 630 may also be referred to as an N/P boundary. As is shown in FIG. 12A, the boundary 630 has corners 640-641 that have sharp angles, for example an angle that is approximately 90 degrees.

Figure 12B:
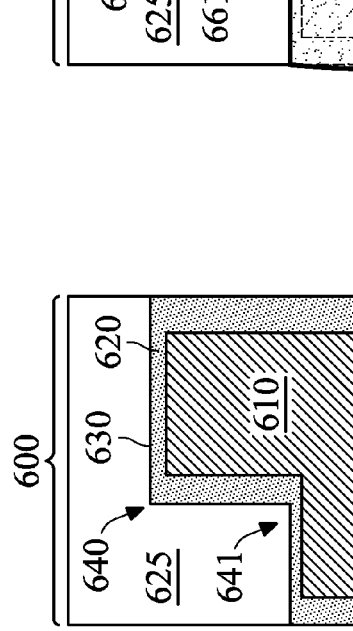

The doped regions 620 and 625 may be formed by various implant and/or epitaxial processes. Referring now to FIG. 12B, an enclosure region 650 defines the N/P boundary 630 between the doped regions 620 and 625. The formation of the enclosure region 650 may involve a mask, for example a photoresist mask in some embodiments. Again, due to various photolithography effects, the enclosure region 650 has rounded corners 660-661, rather than the sharp corners 640-641 in the original layout design as shown in FIG. 12A. Similar to the rounded corners 560-561 in FIG. 11B, the rounded corner 660 slopes inward, and the rounded corner 661 slopes outward.

Figure 12C:
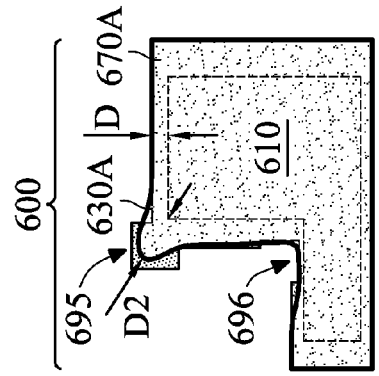

As was the case for the rounded corners 560-561 discussed above, the rounded corners 660-661 are undesirable. Referring to FIG. 12C, the rounded corners 660-661 cause the actually-formed doped region 620A to have distances D1 and D from the N/P boundary 630. Under ideal circumstances, the distance D1 should be greater than D, but the rounding effect discussed above shortens D1 such that D1 is now less than D, which is undesirable.

Figure 12D:
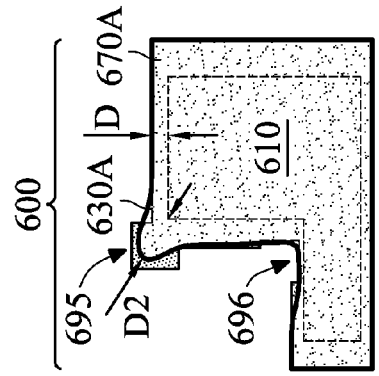

To alleviate the negative impact caused by the rounding effect, an OPC process is again used to revise the layout design of the semiconductor device 600. Referring to FIG. 12D, the layout of the portion of the semiconductor device 600 is revised to include a doped region 670 that is shaped differently from the doped region 620. Again, in the embodiment shown in FIG. 12D, the revised layout design for the doped region 670 has an assist feature 680 and a recess 681, so as to compensate for the corner rounding effect discussed above.

Figure 12E:
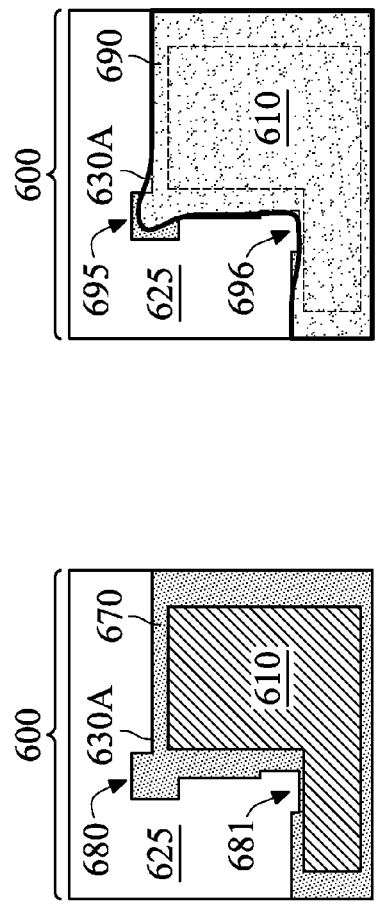
Figure 12F:
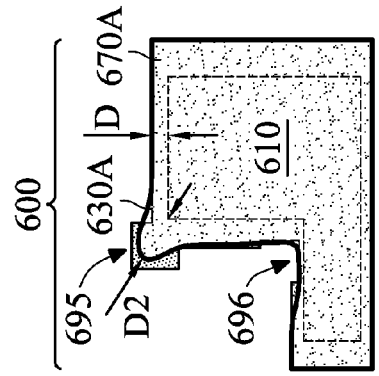

Referring now to FIG. 12E, an enclosure region 690 is formed according to the revised layout design in FIG. 12D to define an N/P boundary 630A. Similar to the case discussed above with reference to FIGS. 11A-11F, the various photolithography effects and the OPC compensation allows the enclosure region 690 to better approximate the doped region 620 in the original layout design, and thus allow the N/P boundary 630A to better the original N/P boundary 630. For example, the N/P boundary 630A has a curved corner 695 that protrudes outward somewhat, as well as a curved corner 696 that protrude inward somewhat, but the degree of protrusion (whether inward or outward) is less pronounced than the corners 660-661. This is also the case for the final structure, i.e., the N/P boundary 630A defined (at least partially) by the doped region 670A as shown in FIG. 12F. Again, the distance D2 between the corner 695 of the N/P boundary 630A and the corner of the active region 610 is greater than the distance D between the upper edge of the N/P boundary 630A and the upper edge of the active region 610.

As was the case for the embodiment discussed above with reference to FIGS. 11A-11F, it is understood that the ripple or wavelike edge between the corners 695-696 as shown in FIG. 12F is not important and may assume any other suitable form. In addition, the modification of the doped region 670 (i.e., by the addition of the assist feature 680 and the removal of a portion of the active region 670 to result in the recess 681) as shown in FIG. 12D is merely an example. In other embodiments, different types of OPC processes may be performed to achieve the shape and profile of the N/P boundary 630A as shown in FIG. 12F, which is a better approximation (but minus the harmful consequences of sharp corners) of the N/P boundary 630 according to its original layout design than if no OPC process was performed.

Figure 13A:
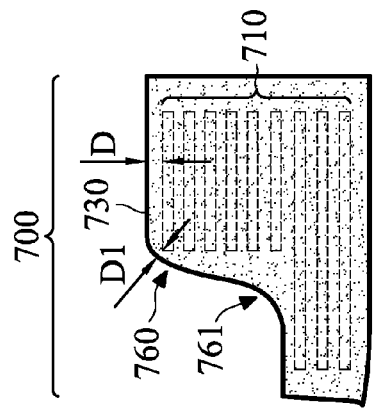
FIGS. 13A-13F are simplified diagrammatic top views of a semiconductor device according to some embodiments of the present disclosure.
Figure 13B:
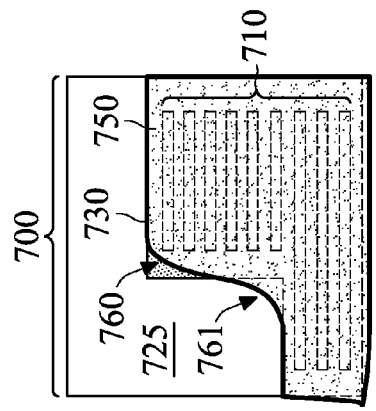
Figure 13C:
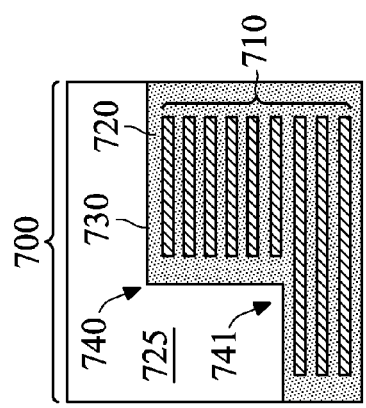
Figure 13D:
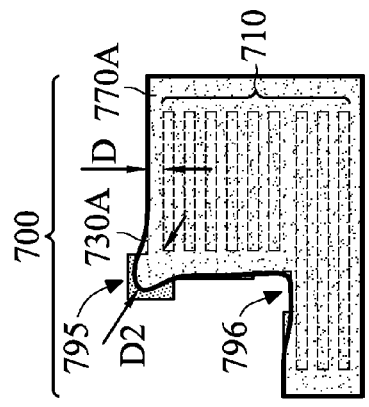
Figure 13E:
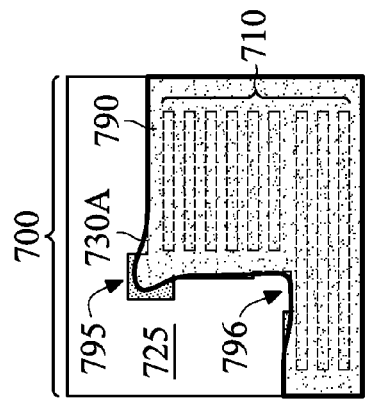
Figure 13F:
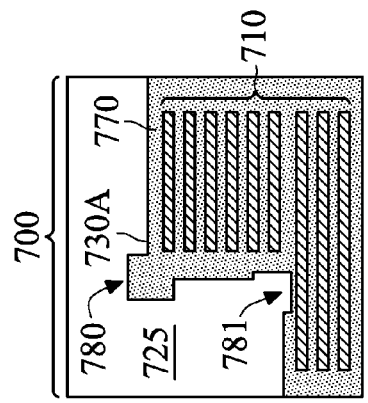

FIGS. 13A-13F are various simplified conceptual top views of a portion of a semiconductor device 700 at various stages of fabrication. The semiconductor device 700 is similar to the semiconductor device 600 discussed above with reference to FIGS. 12A-12F, except that the semiconductor device 700 is a FinFET and has a plurality of fins 710 for its active region. Similar to the case in FIGS. 12A-12F, the semiconductor device 700 has doped regions 720 and 725 that collectively define an N/P boundary 730. The N/P boundary 730 has sharp corners 740-741 that will be formed as rounded corners 760-761 (FIG. 13B-13C) when an enclosure region 750 is formed. This leads to the distance D1 being smaller than D (as shown in FIG. 13C), which is undesirable.

Similar to the case discussed above with reference to FIGS. 12A-12F, OPC is used to form a revised doped region layout design 770, which defines a revised N/P boundary 730A. The revised doped region layout 770 has an assist feature 780 and a recess 781, which after the lithography effects will translate into the corners 795 and 796 of the as-formed enclosure region 790 shown in FIG. 13E. As a result, the final structure (the as formed doped region 770A defining the N/P boundary 730A) shown in FIG. 13F has a D2 that is greater than D1. As such, the OPC process allows the layout design to be modified to alleviate the problems caused by the corner rounding effect associated with the original design.

FIGS. 14A-14F are various simplified conceptual top views of a portion of a semiconductor device 800 at various stages of fabrication. Referring to FIG. 14A, a simplified diagrammatic original layout design of the portion of the semiconductor device 800 is illustrated. The semiconductor device 800 is a FinFET device. According to the original layout design, the portion of the semiconductor device 800 includes a plurality of fins 810 and a plurality of gate lines 820 that intersect with the fins 810. A rectangular Fin-cut window 830 defines the boundaries of the fins 810. However, the Fin-cut window 830 also has sharp corners 840-843, which as discussed above may become rounded corners 850-853 when a photoresist layer 860 is formed to transfer the pattern of the Fin-cut window 830 to the semiconductor device, as shown in FIG. 14B.

Due to the corner rounding effect, the fins 810 as formed may have uneven lengths (horizontal dimensions herein), as shown in FIG. 14C. In more detail, fins 810A and 810B that are impacted by the corner rounding effect will have shorter lengths D1, compared to the rest of the fins not impacted by the corner rounding effect, which will have lengths D. In other words, the fins 810A and 810B as formed are shorter than they should be as a result of the corner rounding effect during the Fin-cut process to define the boundaries of the fins 810.

To remedy this problem, an OPC process is again implemented to revise the layout design of the semiconductor device 800. Referring to FIG. 14D, a revised Fin-cut window 870 has assist features 880-883 added to its corners in order to compensate for the corner rounding effect discussed above. As a result, the photoresist 885 is formed to have corners 890-893 that protrude outward somewhat, as shown in FIG. 14E. The corners 890-893 also have some degree of curvature, which as discussed above reduces the problems such as cracking caused by sharp corners.

Referring now to FIG. 14F, the fins 810A and 810B of the final structure (formed by the Fin-cut photoresist layer 885 shown in FIG. 14E) no longer has the shorter lengths D1. Instead, due to the corners 890-893 that are formed to protrude outward, the fins 810A and 810B that are disposed near the corners 890-893 have lengths D2 that are greater than the length D of the rest of the fins 810.

Note that the longer D2 (compared to D) is actually advantageous, because the lithography process may experience defocus problems. When defocusing occurs, the fins 810A and 810B may shrink more than the rest of the fins 810. Had the layout design (for the Fin-cut) not been revised, the fins as shown in FIG. 14C would have been formed. The fins 810A-810B are already shorter than the rest of the fins, and as shown in FIG. 14C they are barely overlapping with the gate lines 820. Thus, any shrinkage experienced by the fins 810A-810B may cause them to be exposed and not overlapping with the gate lines 820. This is undesirable because FinFET design and fabrication may specify that the fins 810 should be covered by (or overlap with) the gate lines 820, or else it may lead to future fabrication problems.

According to the revised design shown in FIG. 14D, however, the fins 810A-810B formed in the final structure are longer than the rest of the fins 810 (i.e., D2>D). As such, even if the fins 810A-810B experience a greater amount of shrinkage due to the defocusing issues discussed above, they may still be overlapping with the gate lines 820. Therefore, the defocusing issues will not lead to problems in subsequent FinFET fabrication processes.

It is understood that additional processes may be performed to resize the ends of the fins after the Fin-cut process discussed above. These processes may be referred to as line-end resizing processes. In some embodiments, the fins 810 are configured such that, after the subsequent line-end resizing processes, their ends each land near a midpoint of a respective one of the gate lines 820. The fins 810A-810B are configured such that, after the subsequent line-end resizing processes, their ends each land a little past the midpoint of the respective gate lines 820 (since D2>D), so as to account for the fin shrinkage caused by the defocusing discussed above.

For reasons of simplicity, FIG. 14F illustrates the disposition of the fins 810 (and 810A-810B) after the subsequent line-end resizing processes.

FIGS. 15A-15F are various simplified conceptual top views of a portion of a semiconductor device 900 at various stages of fabrication. Referring to FIG. 15A, a simplified diagrammatic original layout design of the portion of the semiconductor device 900 is illustrated. The semiconductor device 900 is a FinFET device. According to the original layout design, the portion of the semiconductor device 900 includes a plurality of fins 910 and a plurality of gate lines 920 that intersect with the fins 910. As part of the FinFET fabrication, a gate replacement process may be performed. This may also be referred to as a Vt open process. As is shown in the illustrated embodiment, a Vt open enclosure window 930 that defines the Vt open enclosure may also be rectangular, similar to the Fin-cut window 830 shown in FIG. 14A discussed above. However, this Vt open enclosure window 930 also has sharp corners, which as discussed above may become rounded corners 950-953 as shown in FIG. 15B due to lithography effects.

Referring now to FIG. 15C, the polysilicon gate lines 920 are replaced by metal gate lines 925-927. Due to the corner rounding effect of the Vt open enclosure window 930, the metal gate lines 925-927 as formed may have uneven lengths. In more detail, gate lines 925 and 927 that are impacted by the corner rounding effect will have shorter lengths D1, compared to the gate line 926 that was not impacted by the corner rounding effect, which will have a length D. In other words, the gate lines 925 and 927 as formed are shorter than they should be as a result of the corner rounding effect during the Vt open enclosure process.

To remedy this problem, an OPC process is again employed to revise the layout design of the semiconductor device 900. Referring to FIG. 15D, a revised Vt open enclosure window 970 has assist features 980-983 added to its corners in order to compensate for the corner rounding effect discussed above, similar to what was done in FIG. 14D. As a result, the Vt open enclosure window is formed to have corners 990-993 that protrude outward somewhat, as shown in FIG. 15E. The corners 990-993 also have some degree of curvature, which as discussed above reduces the problems such as cracking caused by sharp corners.

Referring now to FIG. 15F, the metal gate lines 925 and 927 (replacing the polysilicon gate lines) of the final structure no longer has the shorter lengths D1. Instead, due to the corners 990-993 that protrude outward, the gate lines 925 and 927 that are disposed near the corners 990-993 have lengths D2 that are about the same as the length D of the gate line 926 in the middle. Thus, the revised layout design again helps alleviate the negative effects caused by the corner rounding associated with the original layout design.

Figure 16:
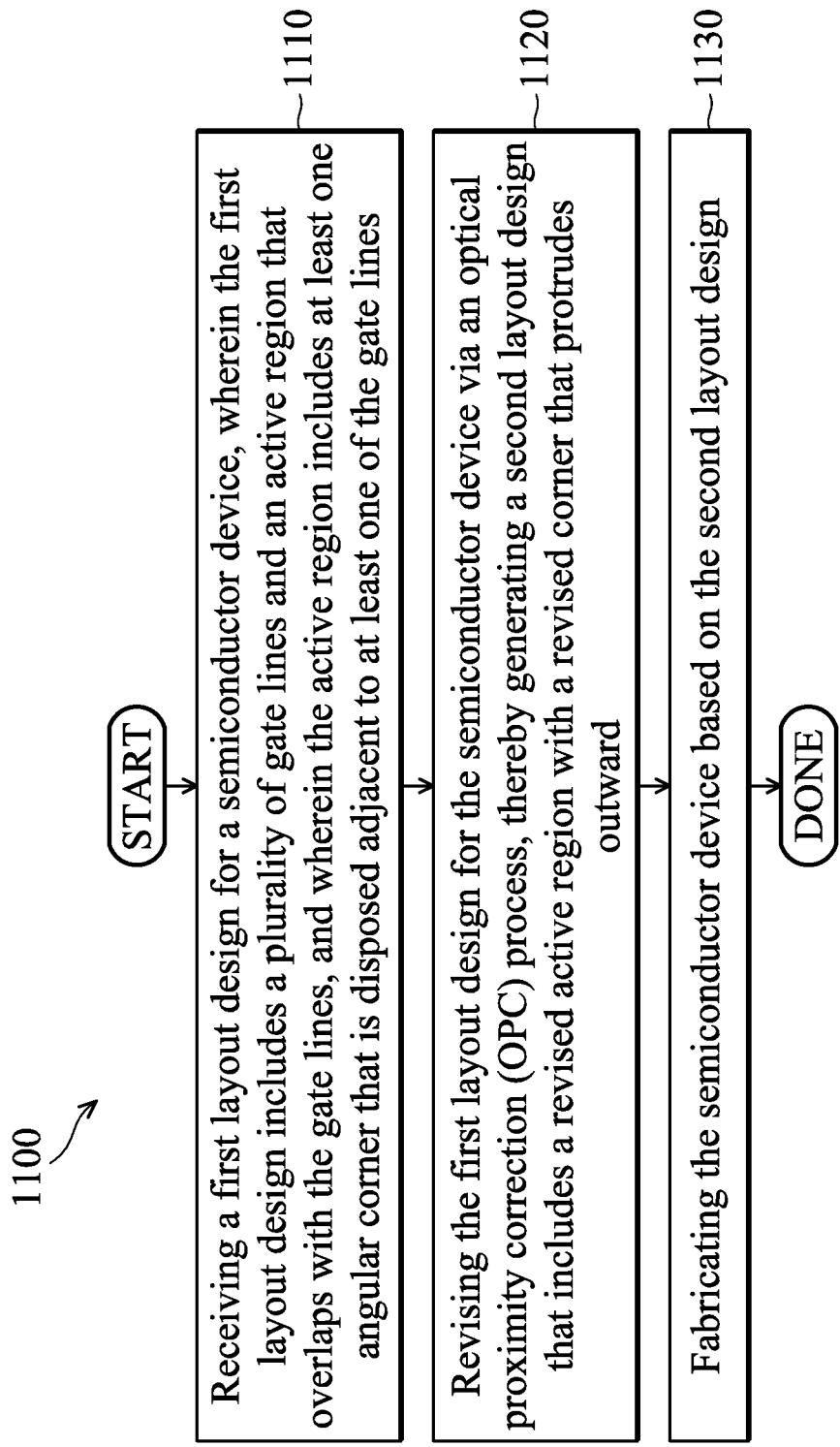
FIGS. 16-18 are different flowcharts illustrating various method of fabricating a semiconductor device according to various aspects of the present disclosure.

FIG. 16 is a method 1100 of fabricating a semiconductor device according to various aspects of the present disclosure. Referring to FIG. 16, the method 1100 includes a step 1110 of receiving a first layout design for a semiconductor device. The first layout design includes a plurality of gate lines and an active region that overlaps with the gate lines. The active region includes at least one angular corner that is disposed adjacent to at least one of the gate lines. In some embodiments, the angular corner of the active region in the first layout design is a convex angular corner. In some embodiments, the active region in the first layout design further includes a concave angular corner.

The method 1100 includes a step 1120 of revising the first layout design for the semiconductor device via an optical proximity correction (OPC) process, thereby generating a second layout design that includes a revised active region with a revised corner that protrudes outward. In some embodiments, the OPC process comprises adding an assist feature to the angular corner. In some embodiments, the OPC process further comprises subtracting a portion of the active region near the concave angular corner.

The method 1100 includes a step 1130 of fabricating the semiconductor device based on the second layout design. In some embodiments, the fabricating comprises patterning the revised active region such that the revised active region includes: a rounded outwardly-protruding corner that corresponds to the convex angular corner in the first layout design; and a rounded inwardly-protruding corner that corresponds to the concave angular corner in the first layout design. In some embodiments, the fabricating of the semiconductor device comprises patterning the revised active region. The patterning is associated with a corner rounding effect. In some embodiments, the angular corner is located sufficiently close to at least one of the gate lines in the first layout design such that, had the first layout design been used to fabricate the semiconductor device, the corner rounding effect would have shrunk an overlap region between the active region and the at least one of the gate lines. In some embodiments, the OPC process in step 1120 comprises adding an assist feature to the angular corner so that, after the semiconductor device has been fabricated based on the second layout design, an overlap region between the revised active region and the at least one of the gate lines is free of being shrunk in spite of the corner rounding effect.

Figure 17:
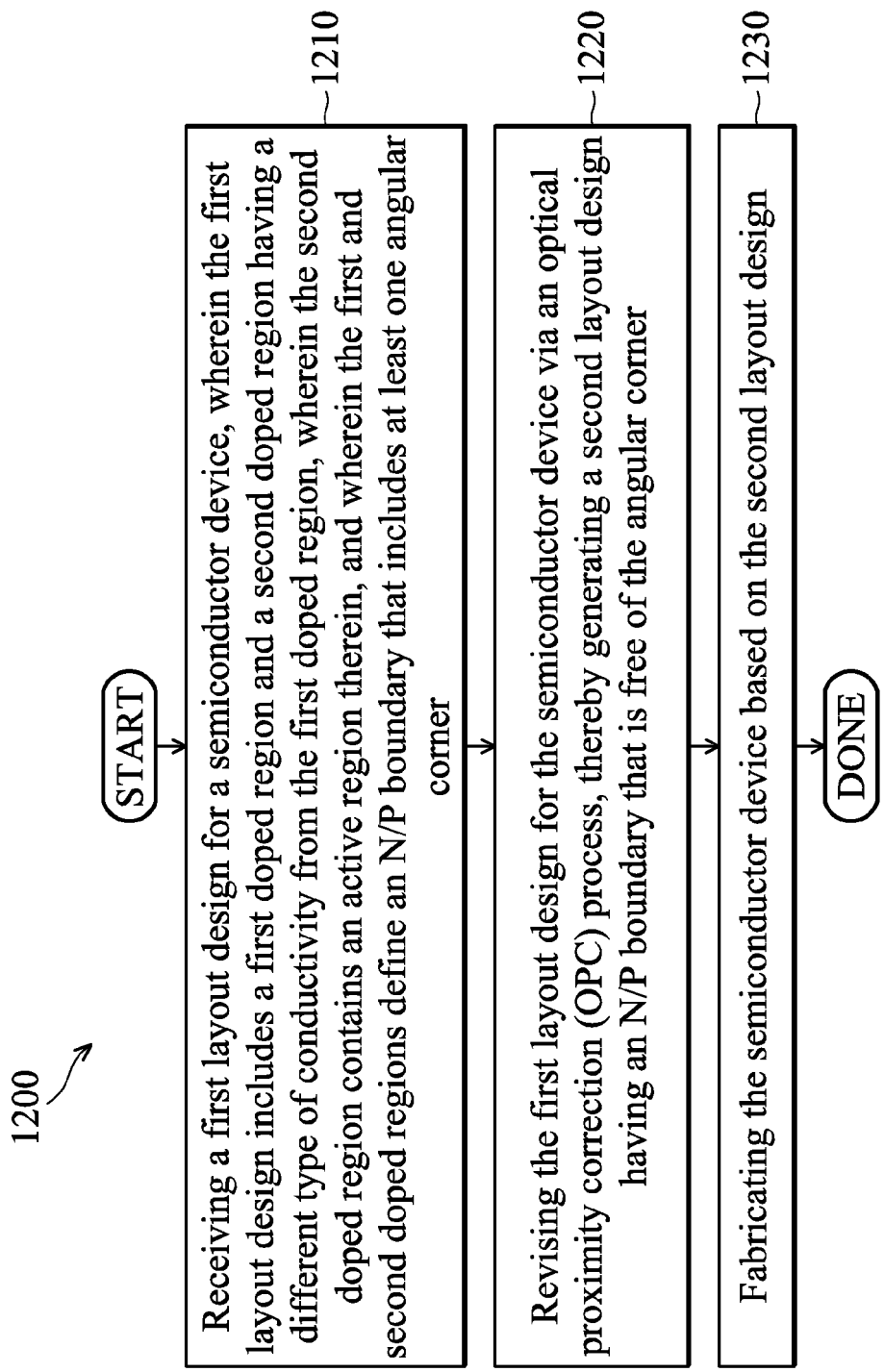

FIG. 17 is a method 1200 of fabricating a semiconductor device according to various aspects of the present disclosure. Referring to FIG. 17, the method 1200 includes a step 1210 of receiving a first layout design for a semiconductor device. The first layout design includes a first doped region and a second doped region having a different type of conductivity from the first doped region. The second doped region contains an active region therein. The first and second doped regions define an N/P boundary that includes at least one angular corner. In some embodiments, the angular corner in the first layout design is a convex angular corner. In some embodiments, the N/P boundary in the first layout design further includes a concave angular corner. In some embodiments, the first layout design further comprises a plurality of elongate fins that are located in the active region.

The method 1200 includes a step 1220 of revising the first layout design for the semiconductor device via an optical proximity correction (OPC) process, thereby generating a second layout design having an N/P boundary that is free of the angular corner. In some embodiments, the OPC process comprises adding an assist feature to the angular corner. In some embodiments, the OPC process further comprises subtracting a portion of the second doped region near the concave angular corner.

The method 1200 includes a step 1230 of fabricating the semiconductor device based on the second layout design. In some embodiments, the fabricating comprises forming the first and second doped regions with an ion implantation process or an epitaxial growth process such that a revised N/P boundary includes: a rounded outwardly-protruding corner that corresponds to the convex angular corner in the first layout design; and a rounded inwardly-protruding corner that corresponds to the concave angular corner in the first layout design. In some embodiments, the fabricating of the semiconductor device comprises patterning the first and second doped regions. The patterning is associated with a corner rounding effect, thereby generating a revised N/P boundary with a rounded outwardly-protruding corner. In some embodiments, the angular corner in the first layout design is located sufficiently close to the active region such that, had the first layout design been used to fabricate the semiconductor device, the corner rounding effect would have rounded the angular corner, thereby shrinking a distance between the active region and the N/P boundary. In some embodiments, the OPC process comprises adding an assist feature to the angular corner so that, after the semiconductor device has been fabricated based on the second layout design, a distance between the active region and the revised N/P boundary is free of being shrunk in spite of the corner rounding effect.

Figure 18:
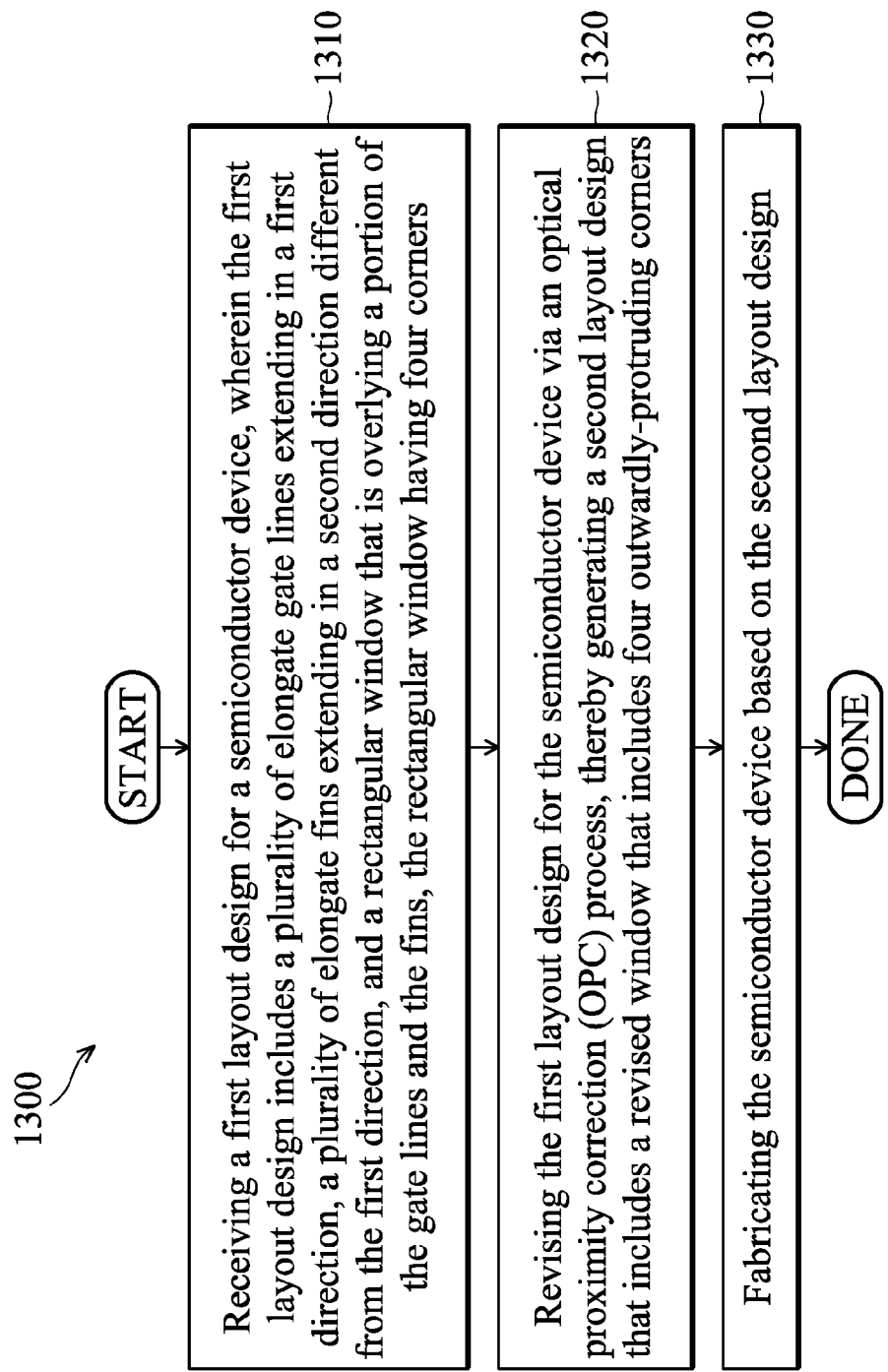

FIG. 18 is a method 1300 of fabricating a semiconductor device according to various aspects of the present disclosure. Referring to FIG. 18, the method 1300 includes a step 1310 of receiving a first layout design for a semiconductor device. The first layout design includes a plurality of elongate gate lines extending in a first direction, a plurality of elongate fins extending in a second direction different from the first direction, and a rectangular window that is overlying a portion of the gate lines and the fins. The rectangular window has four corners. In some embodiments, the rectangular window defines a fin-cut window. In other embodiments, the rectangular window defines a Vt open enclosure.

In some embodiments, the method 1300 includes a step 1320 of revising the first layout design for the semiconductor device via an optical proximity correction (OPC) process, thereby generating a second layout design that includes a revised window that includes four outwardly-protruding corners. In some embodiments, the OPC process comprises adding a respective assist feature to each of the corners of the rectangular window.

In some embodiments, the method 1300 includes a step 1330 of fabricating the semiconductor device based on the second layout design. In some embodiments, the fabricating of the semiconductor device comprises forming a photoresist layer that has four rounded and outwardly-protruding corners. The photoresist layer is patterned according to the revised window.

Figure 19:
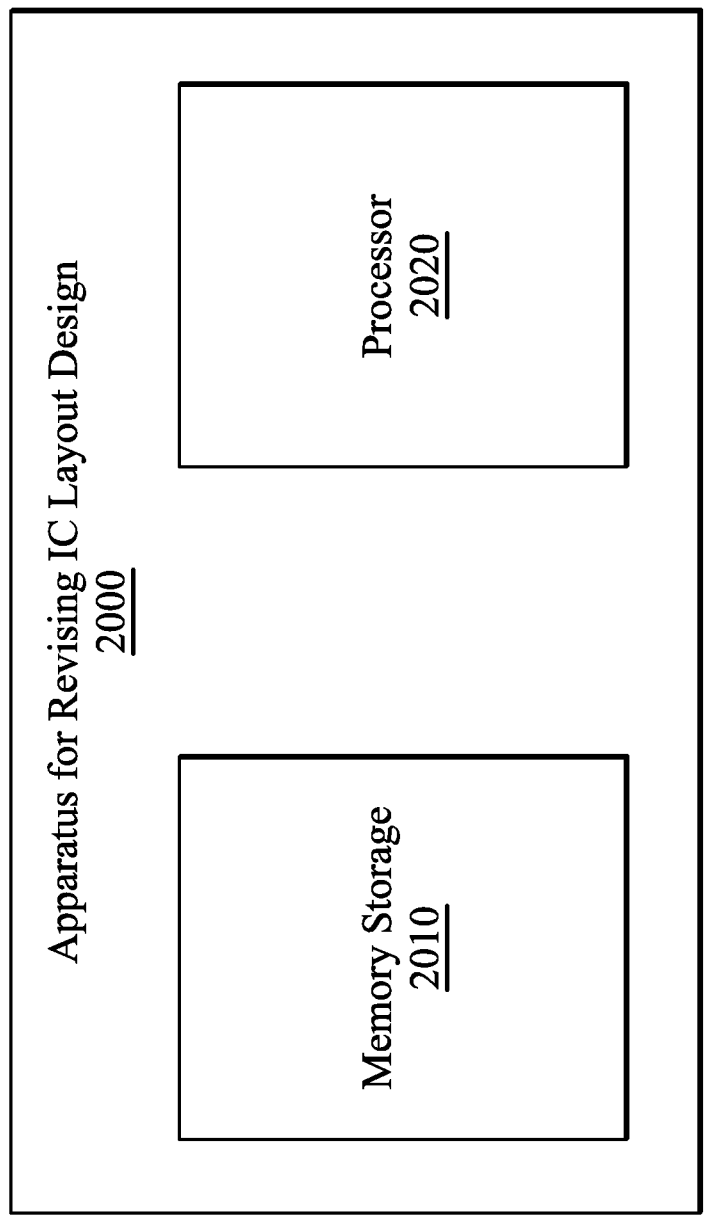
FIG. 19 is a simplified diagrammatic view of a machine that can be used to perform the local re-arrangement of IC layouts according to embodiments of the present disclosure.

FIG. 19 is a simplified diagrammatic view of an apparatus 2000 for revising the layout design as discussed above with reference to FIGS. 11A-11F, 12A-12F, 13A-13F, 14A-14F, 15A-15F, and 16-18. In one embodiment, the apparatus 2000 is a machine that includes a non-transitory computer-readable medium, for example a memory storage component 2010, that stores executable programming instructions. In some embodiments, the memory storage component 2010 may be a system memory component (e.g., Random Access Memory or RAM), a static storage component (e.g., Read-Only Memory ROM), a disk drive component (e.g., magnetic or optical).

The apparatus 2000 may also include a processor component 2020 that executes the executable programming instructions stored in the memory storage component 2010. In some embodiments, the processor component 2020 may include a processor, a micro-controller, a digital signal processor (DSP), etc.

Logic may be encoded in a computer readable medium of the memory storage component 2010, which may refer to any medium that stores instructions for execution. Such a medium may take many forms, including but not limited to, non-volatile media and volatile media. In one embodiment, the computer readable medium is non-transitory. In various implementations, non-volatile media includes optical or magnetic storage devices, such as disk drives, and volatile media may include dynamic memory. Some common forms of computer readable media includes, for example, floppy storage device, flexible storage device, hard storage device, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer is adapted to read.

The executed instructions allow the processor component 2020 to revise the layout design, for example according to the methods 1100, 1200 and 1300 discussed above. The revised layout design may then be used to fabricate a semiconductor device, for example a FinFET device and/or a metal gate device.

Although not specifically illustrated for reasons of simplicity, the apparatus 2000 may further include a network interface component (e.g., a modem or an Ethernet card), a display component (e.g., touch-screens, cathode ray tube (CRT) displays, or a liquid crystal display (LCD)), an input/output component (e.g., keyboard or touch-sensitive components operable to detect a touch by a human body), a cursor control component (e.g., mouse or trackball), an image capture component (e.g., analog or digital camera), or an electronic database.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
    receiving a first layout design for a semiconductor device, wherein the first layout design includes a plurality of gate lines and doped active region that overlaps with the gate lines, and wherein the active region includes at least one angular corner that is disposed adjacent to at least one of the gate lines;
    revising the first layout design for the semiconductor device via an optical proximity correction (OPC) process, thereby generating a second layout design that includes a revised active region with a revised corner that protrudes outward; and
    fabricating the semiconductor device based on the second layout design.

2. The method of claim 1, wherein the OPC process comprises adding an assist feature to the angular corner.

3. The method of claim 1, wherein:
    the angular corner of the active region in the first layout design is a convex angular corner;
    the active region in the first layout design further includes a concave angular corner; and
    the OPC process further comprises subtracting a portion of the active region near the concave angular corner.

4. The method of claim 3, wherein the fabricating comprises patterning the revised active region such that the revised active region includes:
    a rounded outwardly-protruding corner that corresponds to the convex angular corner in the first layout design; and
    a rounded inwardly-protruding corner that corresponds to the concave angular corner in the first layout design.

5. The method of claim 1, wherein the fabricating of the semiconductor device comprises patterning the revised active region, and wherein the patterning is associated with a corner rounding effect.

6. The method of claim 5, wherein the angular corner is located sufficiently close to at least one of the gate lines in the first layout design such that, had the first layout design been used to fabricate the semiconductor device, the corner rounding effect would have shrunk an overlap region between the active region and the at least one of the gate lines.

7. The method of claim 6, wherein the OPC process comprises adding an assist feature to the angular corner so that, after the semiconductor device has been fabricated based on the second layout design, an overlap region between the revised active region and the at least one of the gate lines is free of being shrunk in spite of the corner rounding effect.

8. A method of fabricating a semiconductor device, comprising:
    receiving a first layout design for a semiconductor device, wherein the first layout design includes a first doped region and a second doped region having a different type of conductivity from the first doped region, wherein the second doped region contains an active region therein, and wherein the first and second doped regions define an N/P boundary that includes at least one angular corner;
    revising the first layout design for the semiconductor device via an optical proximity correction (OPC) process, thereby generating a second layout design having an N/P boundary that is free of the angular corner; and
    fabricating the semiconductor device based on the second layout design.

9. The method of claim 8, wherein the OPC process comprises adding an assist feature to the angular corner.

10. The method of claim 8, wherein:
    the angular corner in the first layout design is a convex angular corner;
    the N/P boundary in the first layout design further includes a concave angular corner; and
    the OPC process further comprises subtracting a portion of the second doped region near the concave angular corner.

11. The method of claim 10, wherein the fabricating comprises forming the first and second doped regions with an ion implantation process or an epitaxial growth process such that a revised N/P boundary includes:
    a rounded outwardly-protruding corner that corresponds to the convex angular corner in the first layout design; and
    a rounded inwardly-protruding corner that corresponds to the concave angular corner in the first layout design.

12. The method of claim 8, wherein the fabricating of the semiconductor device comprises patterning the first and second doped regions, and wherein the patterning is associated with a corner rounding effect, thereby generating a revised N/P boundary with a rounded outwardly-protruding corner.

13. The method of claim 12, wherein the angular corner in the first layout design is located sufficiently close to the active region such that, had the first layout design been used to fabricate the semiconductor device, the corner rounding effect would have rounded the angular corner, thereby shrinking a distance between the active region and the N/P boundary.

14. The method of claim 13, wherein the OPC process comprises adding an assist feature to the angular corner so that, after the semiconductor device has been fabricated based on the second layout design, a distance between the active region and the revised N/P boundary is free of being shrunk in spite of the corner rounding effect.

15. The method of claim 8, wherein the first layout design further comprises a plurality of elongate fins that are located in the active region.

16. A method of fabricating a semiconductor device, comprising:
- receiving a first layout design for a semiconductor device, wherein the first layout design includes a plurality of elongate gate lines extending in a first direction, a plurality of elongate fins extending in a second direction different from the first direction, and a rectangular window that is overlying a portion of the gate lines and the fins, the rectangular window having four corners;
- revising the first layout design for the semiconductor device via an optical proximity correction (OPC) process, thereby generating a second layout design that includes a revised window that includes four outwardly-protruding corners; and
- fabricating the semiconductor device based on the second layout design.

17. The method of claim 16, wherein the OPC process comprises adding a respective assist feature to each of the corners of the rectangular window.

18. The method of claim 16, wherein the fabricating of the semiconductor device comprises forming a photoresist layer that has four rounded and outwardly-protruding corners, wherein the photoresist layer is patterned according to the revised window.

19. The method of claim 16, wherein the rectangular window defines a fin-cut window.

20. The method of claim 16, wherein the rectangular window defines a Vt open enclosure.

* * * * *